(12) United States Patent
Sugisaki

(10) Patent No.: US 11,049,870 B2
(45) Date of Patent: Jun. 29, 2021

(54) SEMICONDUCTOR MEMORY DEVICE

(71) Applicant: Toshiba Memory Corporation, Minato-ku (JP)

(72) Inventor: Tsuyoshi Sugisaki, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/298,078

(22) Filed: Mar. 11, 2019

(65) Prior Publication Data

US 2020/0098776 A1 Mar. 26, 2020

(30) Foreign Application Priority Data

Sep. 20, 2018 (JP) .............................. JP2018-175779

(51) Int. Cl.
| *H01L 27/11573* | (2017.01) |
| *H01L 27/11578* | (2017.01) |
| *H01L 27/1157*  | (2017.01) |
| *H01L 27/11565* | (2017.01) |

(52) U.S. Cl.
CPC .... *H01L 27/11573* (2013.01); *H01L 27/1157* (2013.01); *H01L 27/11565* (2013.01); *H01L 27/11578* (2013.01)

(58) Field of Classification Search
CPC ........... H01L 27/11568; H01L 27/1157; H01L 27/11573; H01L 27/11578
See application file for complete search history.

(56) References Cited

U.S. PATENT DOCUMENTS

| 6,756,262 B1 | 6/2004 | Nakamura et al. |
| 8,476,708 B2* | 7/2013 | Fukuzumi ......... H01L 27/11573 |
| | | 257/350 |
| 9,252,148 B2* | 2/2016 | Hasegawa ......... H01L 29/66477 |
| 10,090,315 B2 | 10/2018 | Fukuzumi et al. |
| 10,354,987 B1* | 7/2019 | Mushiga ........... H01L 21/76898 |
| 2009/0267128 A1 | 10/2009 | Maejima |
| 2009/0268522 A1 | 10/2009 | Maejima |
| 2010/0207195 A1 | 8/2010 | Fukuzumi et al. |
| 2011/0143506 A1* | 6/2011 | Lee .................... H01L 27/0688 |
| | | 438/238 |
| 2011/0284946 A1 | 11/2011 | Kiyotoshi |
| 2015/0206587 A1 | 7/2015 | Hasegawa et al. |

FOREIGN PATENT DOCUMENTS

| JP | 10-22483 | 1/1998 |
| JP | 2016-62901 | 4/2016 |
| JP | 2017-504217 | 2/2017 |
| TW | 564547 B | 12/2003 |

\* cited by examiner

*Primary Examiner* — Phat X Cao
(74) *Attorney, Agent, or Firm* — Oblon, McClelland, Maier & Neustadt, L.L.P.

(57) ABSTRACT

According to one embodiment, a semiconductor memory device includes a semiconductor substrate, a memory cell array, first circuitry and a via. The semiconductor substrate includes a first main surface and a second main surface opposite the first main surface. The memory cell array is provided on the first main surface. The memory cell array includes stacked memory cells. The first circuitry is provided on the second main surface. The first circuitry is configured to operate the memory cells. The via penetrates through the semiconductor substrate. The via provides electrical connection between the memory cells and the first circuitry.

16 Claims, 18 Drawing Sheets

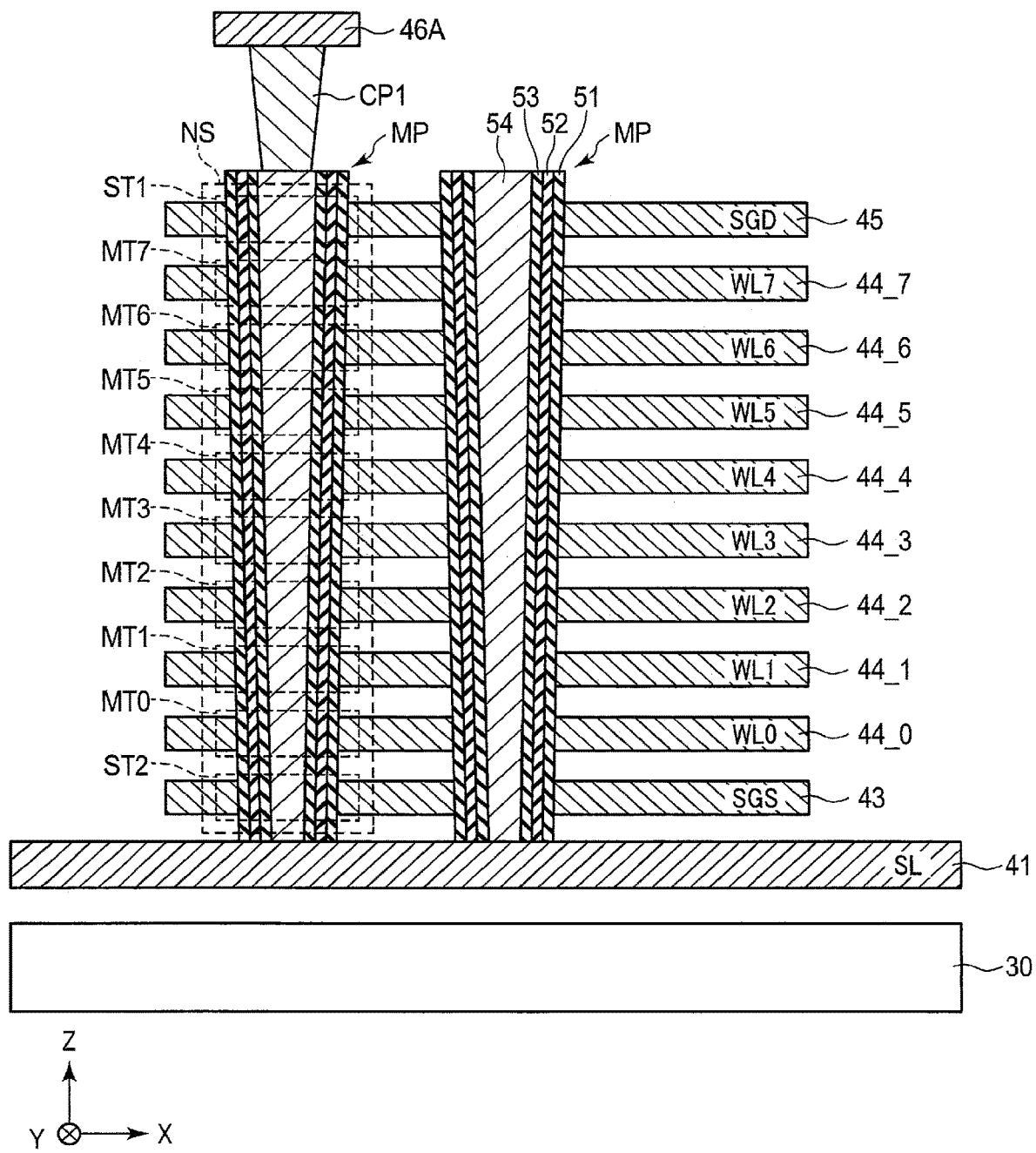
F I G. 4

SEMICONDUCTOR MEMORY DEVICE

CROSS-REFERENCE TO RELATED APPLICATIONS

This application is based upon and claims the benefit of priority from Japanese Patent Application No. 2018-175779, filed Sep. 20, 2018, the entire contents of which are incorporated herein by reference.

FIELD

Embodiments described herein relate generally to a semiconductor memory device.

BACKGROUND

A semiconductor memory device with three-dimensionally arranged memory cells is known.

BRIEF DESCRIPTION OF THE DRAWINGS

FIG. 4 is a sectional view of memory cell transistors in the memory cell array according to the first embodiment.

DETAILED DESCRIPTION

In general according to one embodiment, a semiconductor memory device includes a semiconductor substrate, a memory cell array, first circuitry and a via. The semiconductor substrate includes a first main surface and a second main surface opposite the first main surface. The memory cell array is provided on the first main surface. The memory cell array includes stacked memory cells. The first circuitry is provided on the second main surface. The first circuitry is configured to operate the memory cells. The via penetrates through the semiconductor substrate. The via provides electrical connection between the memory cells and the first circuitry.

Embodiments will be described, where the same reference symbols may be used for the components having substantially the same functions and configurations. Also, each embodiment will be set forth as an example of devices or methods for embodying the technical idea of the embodiment. The embodiments are not limited to materials, shapes, structures, arrangement, or the like of the components which will be described.

Each functional block may be realized in the form of hardware, computer software, or a combination thereof. It is not a requisite to organize functional blocks in such a manner as will be described for exemplary functional blocks. For example, a function may be partly implemented by a functional block which differs from the exemplary functional blocks. Moreover, the exemplary functional blocks may each be divided into more specific functional blocks. The description will assume an instance where the semiconductor memory device is a three-dimensionally stacked NAND flash memory that includes memory cell transistors stacked above a semiconductor substrate.

First Embodiment

A semiconductor memory device according to the first embodiment will be described.

Figure 1:
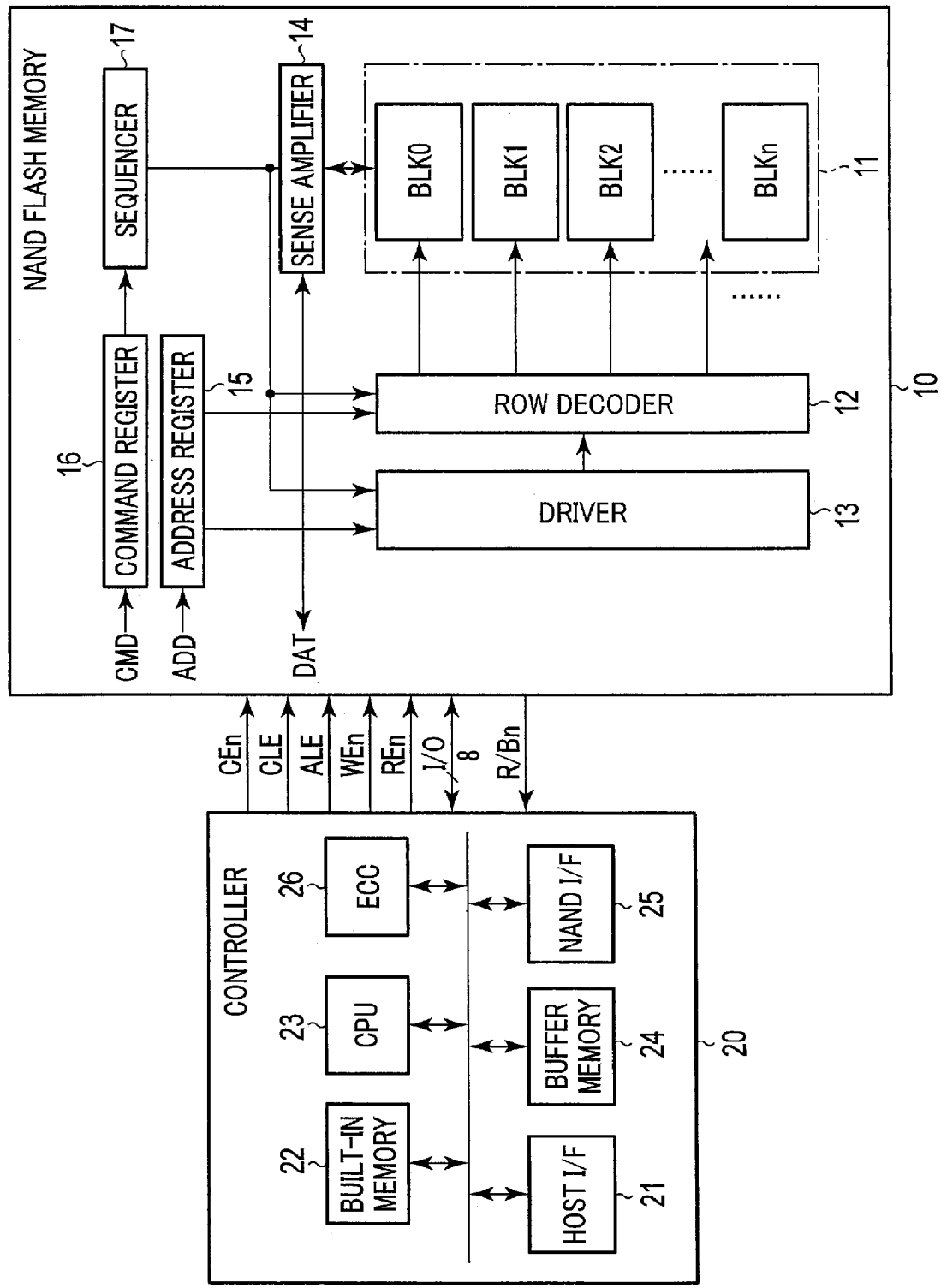
FIG. 1 is a block diagram showing a configuration of a semiconductor memory device according to a first embodiment.

1. Configuration of Semiconductor Memory Device 1.1 Block Configuration of Semiconductor Memory Device FIG. 1 is a block diagram showing a configuration of the semiconductor memory device according to the first embodiment. A NAND flash memory 10, adopted as the semiconductor memory device, includes a memory cell array 11, a row decoder 12, a driver 13, a sense amplifier 14, an address register 15, a command register 16, and a sequencer 17. Also, as an exemplary configuration, there is a controller 20 connected to the NAND flash memory 10 through an external NAND bus. The controller 20 is adapted to access and control the NAND flash memory 10.

1.1.1 Configuration of Each Block

The memory cell array 11 includes one or more blocks BLK0, BLK1, BLK2, ... and BLKn (n being 0 or a greater integer) each including multiple nonvolatile memory cells associated with rows and columns. In principle, the following description will use "block BLK" to refer to any one of the blocks BLK0 to BLKn. The memory cell array 11 stores data provided from the controller 20. The memory cell array 11 and the block BLK will be described in more detail later.

The row decoder 12 selects one block BLK, and further selects a word line in the selected block BLK. The row decoder 12 will be described in more detail later.

The driver 13 supplies voltage to the selected block BLK through the row decoder 12.

The sense amplifier 14, at the time of data read, senses data DAT read from the memory cell array 11 and performs necessary mathematical operations. The sense amplifier 14 then outputs this data DAT to the controller 20. At the time of data write, the sense amplifier 14 transfers write data DAT received from the controller 20 to the memory cell array 11.

The address register 15 stores an address ADD received from the controller 20. The address ADD includes a block address designating an operation target block BLK, as well as a page address indicative of an operation target word line within the designated block. The command register 16 stores a command CMD received from the controller 20. Examples of the command CMD include a write command for the sequencer 17 to perform a write operation, and a read command for the sequencer 17 to perform a read operation.

The sequencer 17 controls operations of the NAND flash memory 10 based on the command CMD stored in the command register 16. More specifically, the sequencer 17 controls the row decoder 12, the driver 13, and the sense amplifier 14 based on a write command stored in the command register 16, to write into multiple memory cell transistors designated by the address ADD. The sequencer 17 also controls the row decoder 12, the driver 13, and the sense amplifier 14 based on a read command stored in the command register 16, to read from multiple memory cell transistors designated by the address ADD.

As discussed, the controller 20 is connected to the NAND flash memory 10 through the NAND bus. The NAND bus allows for signal transmission and reception according to a NAND interface. More specifically, the NAND bus includes a bus for communicating a chip enable signal CEn, a command latch enable signal CLE, an address latch enable signal ALE, a write enable signal WEn, a read enable signal REn, an input/output signal I/O, and a ready/busy signal R/Bn. The input/output signal I/O is transmitted using an 8-bit bus width. The input/output signal I/O conveys the command CMD, the address ADD, the data DAT, etc.

Next, the configuration of the controller 20 will be described with reference to FIG. 1. The controller 20 includes a host interface (I/F) circuit 21, a built-in memory 22, a processor (CPU) 23, a buffer memory 24, a NAND interface (I/F) circuit 25, an ECC (error checking and correcting) circuit 26.

The host interface circuit 21 is connected to a host device (not illustrated) through a host bus. The host interface circuit 21 transfers a command and data received from the host device to the processor 23 and the buffer memory 24, respectively. Also, the host interface circuit 21 transfers data in the buffer memory 24 to the host device, in response to a command from the processor 23.

The processor 23 takes total control over the operations of the controller 20. For example, upon receipt of a write command from the host device, the processor 23 issues a write command for the NAND interface circuit 25. Write and erase operations may also proceed in this manner. Also, the processor 23 performs a variety of processing, such as wear leveling, for managing the NAND flash memory 10. Note that the following operations of the controller 20 may be implemented by the processor 23 executing software (or firmware), or may be implemented by hardware.

The NAND interface circuit 25 is connected to the NAND flash memory 10 through the NAND bus, and controls communication with the NAND flash memory 10. The NAND interface circuit 25 sends various signals to the NAND flash memory 10, or receives various signals from the NAND flash memory 10, based on the commands received from the processor 23.

The buffer memory 24 temporarily stores write data or read data. The buffer memory 24 may be constituted by a DRAM, an SRAM, or the like.

The built-in memory 22 is, for example, a semiconductor memory such as a DRAM or an SRAM, and utilized as a work area for the processor 23. The built-in memory 22 stores firmware for managing the NAND flash memory 10, various management tables, etc.

The ECC circuit 26 performs error detection and correction processes for the data stored in the NAND flash memory 10. That is, the ECC circuit 26 generates an error-correcting code and puts it to corresponding write data at the time of data write, and decodes the error-correcting code at the time of data read.

1.1.2 Circuit Configuration of Memory Cell Array 11

As explained earlier, the memory cell array 11 includes the blocks BLK0 to BLKn. A description will now be given of the circuit configuration of one block BLK.

Figure 2:
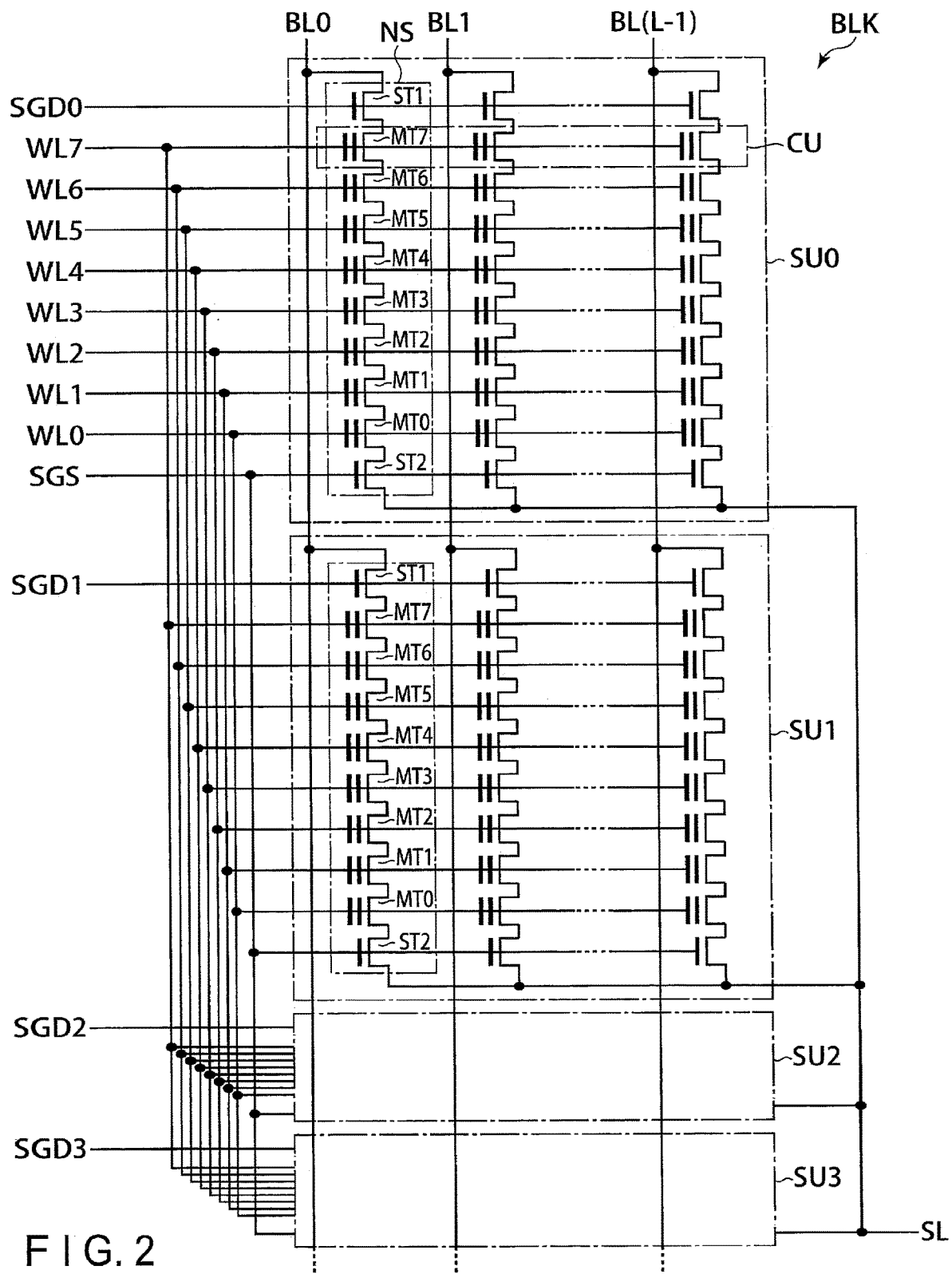
FIG. 2 is a circuit diagram of a block constituting a memory cell array according to the first embodiment.

FIG. 2 is a circuit diagram of the block BLK included in the memory cell array 11. As shown in the figure, the block BLK includes, for example, four string units SU0 to SU3. In principle, the following description will use "string unit SU" to refer to any one of the string units SU0 to SU3. The string unit SU includes multiple NAND strings NS.

The NAND strings NS each include, for example, eight memory cell transistors MT0 to MT7, and select transistors ST1 and ST2. In principle, the following description will use "memory cell transistor MT" to refer to any one of the memory cell transistors MT0 to MT7. The memory cell transistor MT, which may also be called a "memory cell", includes a control gate and a charge storage layer, and stores data in a nonvolatile manner. The memory cell transistors MT are connected in series between the source of the select transistor ST1 and the drain of the select transistor ST2.

The string units SU0 to SU3 include their respective, multiple select transistors ST1, and the gates of these select transistors ST1 are connected to select gate lines SGD0 to SGD3 for the string units SU0 to SU3, respectively. On the other hand, the gates of the multiple select transistors ST2 in each of the string units SU0 to SU3 are connected to, for example, a single select gate line SGS. The gates of the select transistors ST2 may instead be connected to different select gate lines SGS0 to SGS3 for the corresponding string units, respectively. In the string units SU0 to SU3 within the block BLK, the control gates of the memory cell transistors MT0 to MT7 are connected to respective word lines WL0 to WL7.

In the memory cell array 11, the multiple blocks BLK0 to BLKn share bit lines BL0 to BL(L−1). Here, L is a natural number equal to or greater than 2. Across the multiple string units SU0 to SU3 within one block BLK, each bit line BL is connected to the drains of the select transistors ST1 in the NAND strings NS arranged on the same column. That is, each bit line BL provides common connection for the NAND strings NS among the multiple string units SU0 to SU3 on the same column. Furthermore, the sources of the multiple select transistors ST2 are all connected to a source line SL. As such, one string unit SU includes the multiple. NAND strings NS connected to different bit lines BL and the same select gate line SGD.

The block BLK includes the multiple string units SU sharing the common word lines WL.

A group of multiple memory cell transistors MT, connected to the common word line WL within the string unit SU, is called a "cell unit CU". The cell unit CU varies its storage capacity depending on the number of bits of data stored by the memory cell transistors MT. For example, the cell unit CU stores 1-page data when each memory cell transistor MT is adapted to store 1-bit data, stores 2-page data when each memory cell transistor MT is adapted to store 2-bit data, and stores 3-page data when each memory cell transistor MT is adapted to store 3-bit data.

Note that the configuration of the memory cell array 11 is not limited to the foregoing description. For example, the number of the string units SU in each block BLK may be discretionarily determined. The number of the memory cell transistors MT in each NAND string NS, and the numbers of the select gate transistors ST1 and ST2 may be discretionarily determined, as well.

1.2 Sectional Structure of Semiconductor Memory Device

Figure 3:
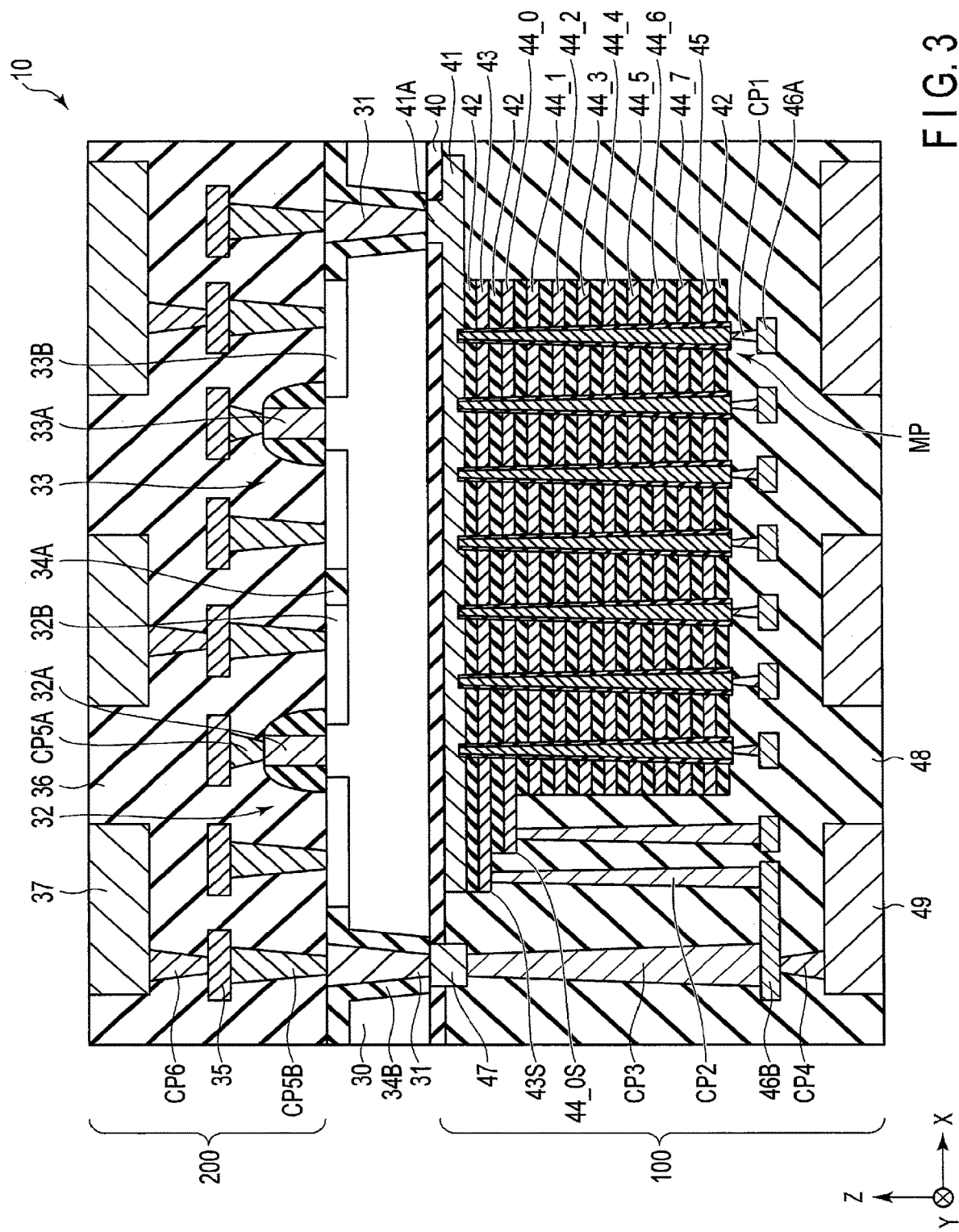
FIG. 3 is a sectional view of the semiconductor memory device according to the first embodiment.

Next, the sectional structure of the semiconductor memory device according to the first embodiment will be described with reference to FIG. 3. FIG. 3 is a sectional view of the semiconductor memory device according to the first embodiment. FIG. 3 assumes two directions orthogonal to each other and parallel to the surface of a semiconductor substrate 30 to be X and Y directions, and a direction orthogonal to these X and Y directions (X-Y plane) to be a Z direction (stacking direction). FIG. 3 shows the cross section along the X direction, in which the word lines extend.

As shown in FIG. 3, the NAND flash memory 10 as the semiconductor memory device includes a memory array area 100 provided on a first main surface of the semiconductor substrate 30, and a peripheral circuit area 200 provided on a second main surface of the semiconductor substrate 30 opposite the first main surface. A silicon semiconductor substrate may be adopted as the semiconductor substrate 30, for example.

The memory array area 100 embraces the memory cell array 11. The peripheral circuit area 200 embraces peripheral circuitry for controlling data write, data read, and data erase with the memory cell transistors MT. More specifically, the peripheral circuit area 200 embraces the row decoder 12, the driver 13, the sense amplifier 14, the address register 15, the command register 16 and the sequencer 17.

The semiconductor substrate 30 has vias 31 for electrical connections between the circuits in the memory array area 100 and the circuits in the peripheral circuit area 200. The vias 31 are each formed to extend from the second main surface to the first main surface of the semiconductor substrate 30 (e.g., silicon semiconductor substrate). Each via 31 may be called "TSV" (through silicon via) 31.

1.2.1 Structure of Memory Array Area 100

The structure of the memory array area 100 will be described in more detail with reference to FIG. 3.

An insulation layer 40 and conductive pads 47 and 41A is provided on the first main surface of the semiconductor substrate 30. The insulation layer 40 may be, for example, a silicon oxide layer. A conductive layer 41 is provided on the insulation layer 40 and the conductive pad 41A. The conductive layer 41 functions as the source line SL. The conductive layer 41 and the conductive pad 41A include, for example, tungsten (W) or polycrystalline silicon. The conductive pad 47 includes, for example, tungsten (W).

Alternately stacked multiple insulation layers 42 and multiple conductive layers 43, 44_0, 44_1, 44_2, ... 44_7, and 45 are provided on the conductive layer 41. The conductive layers 43, 44_0 to 44_7, and 45 extend in the X direction. The conductive layer 43 functions as the select gate line SGS. The conductive layers 44_0 to 44_7 function as the respective word lines WL0 to WL7. The conductive layer 45 functions as the select gate line SGD. The insulation layer 42 may be, for example, a silicon oxide layer. The conductive layers 43, 44_0 to 44_7, and 45 include, for example, tungsten (W).

Memory pillars MP are provided in the multiple insulation layers 42 and the multiple conductive layers 43, 44_0 to 44_7, and 45. The Memory pillars MP each has a columnar shape extending in the Z direction. Each memory pillar MP has one end connected to the conductive layer 41 (source line SL). The other end of each memory pillar MP reaches the top face of the uppermost insulation layer 42. As such, one memory pillar MP extends from the top face of the insulation layer 42 to the source line SL, through the select gate line SGD, the multiple word lines WL0 to WL7, the select gate line SGS, and the multiple insulation layers 42. A contact plug CP1 extending in the Z direction is provided on the other end of the memory pillar MP, and a conductive layer 46A is provided on the contact plug CP1. The conductive layer 46A functions as, for example, the bit line EL. The contact plug CP1 and the conductive layer 46A include, for example, tungsten (W). The memory pillars MP will be described in more detail later.

The conductive layers 43, 44_0 to 44_7, and 45 are sequentially drawn in the X direction so that they each have a region showing a stepped profile (hereinafter, "staircase region"). Note that FIG. 3 illustrates the conductive layers 43 and 44_0 having their respective staircase regions 43S and 44_0S, and omits the staircase regions of the other conductive layers. However, the other conductive layers are also sequentially drawn in the X direction to have the respective staircase regions. Each staircase region is provided with a contact plug CP2 extending in the Z direction. The contact plug CP2 is provided with a conductive layer 46B. The conductive layer 46B is provided with a contact plug CP3 extending in the Z direction toward the semiconductor substrate 30. The conductive pad 47 is arranged on the contact plug CP3. The conductive layer 46B is further provided with a contact plug CP4 extending away from the semiconductor substrate 30 in the Z direction. Thus, the staircase regions of the conductive layers 43, 44_0 to 44_7, and 45 are each electrically connected to the contact plug CP2, the conductive layer 46B, and the contact plug CP3. Also, the staircase regions of the conductive layers 43, 44_0 to 44_7, and 45 are each electrically connected to the contact plug CP2, the conductive layer 46B, and the contact plug CP4 as needed. The contact plugs CP2, CP3, and CP4, and the conductive layer 46B include, for example, tungsten (W).

The conductive layers 43, 44_0 to 44_7, 45, 46A, and 46B, the conductive pad 47, and the contact plugs CP1 to CP4 are surrounded by an insulation layer 48. The insulation layer 48, at its upper face, is provided with electrode pads 49. The electrode pads 49 are each electrically connected to the conductive layer 46B through, for example, the contact plug CP4. The electrode pads 49 include, for example, copper (Cu) or aluminum (Al).

1.2.2 Structure of Peripheral Circuit Area 200

Next, the structure of the peripheral circuit area 200 will be described in more detail with reference to FIG. 3.

The second main surface of the semiconductor substrate 30 is provided with an n-channel MOS transistor (nMOS transistor) 32 and a p-channel MOS transistor (pMOS transistor) 33. There is an element isolation region 34A, e.g., a shallow trench isolation (STI), between the nMOS transistor 32 and the pMOS transistor 33 so that these transistors are isolated from each other. The element isolation region 34A may include, for example, a silicon oxide layer.

The semiconductor substrate 30 has the TSV 31 within it. An insulation layer 34B is provided between the TSV 31 and the semiconductor substrate 30. One end of the TSV 31 is connected, for example, to the conductive layer 41 through the conductive pad 41A, or to the contact plug CP3 through the conductive pad 47. The TSV 31 includes, for example, tungsten (W). The insulation layer 34B may be, for example, a silicon oxide layer.

Gates 32A and 33A are provided on the second main surface of the semiconductor substrate 30 through a gate insulation film (not illustrated). A contact plug CP5A extending in the Z direction is provided on the gates 32A and 33A of the nMOS transistor 32 and the pMOS transistor 33, respectively. A contact plug CP5B extending in the Z direction is provided on a source or drain 32B of the nMOS transistor 32, a source or drain 33B of the pMOS transistor 33, and the other end of the TSV 31, respectively. A conductive layer 35 is provided on the contact plugs CP5A and CP5B, respectively. A contact plug CP6 extending in the Z direction is provided on the conductive layer 35. The contact plugs CP5A, CP5B, and CP6 include, for example, tungsten (W). The conductive layer 35 includes, for example, tungsten (W) or copper (Cu).

The nMOS transistor 32, the pMOS transistor 33, the conductive layer 35, and the contact plugs CP5A, CP5B, and CP6 are surrounded by an insulation layer 36. Electrode pads 37 are provided on an upper face of the insulation layer 36. For example, one electrode pad 37 is electrically connected to the staircase region 43S of the conductive layer 43, through the contact plug CP6, the conductive layer 35, the contact plug CP5B, the TSV 31, the conductive pad 47, the contact plug CP3, the conductive layer 46B, and the contact plug CP2. Also, another electrode pad 37 is electrically connected to the source or drain 32B of the nMOS transistor 32 through the contact plug CP6, the conductive layer 35, and the contact plug CP5B. The insulation layer 36 may be, for example, a silicon oxide layer. The electrode pads 37 include, for example, copper (Cu) or aluminum (Al).

1.2.3 Structure of Memory Pillars MP (Memory Cell Transistors)

Next, a description will be given of the sectional structure of the memory cell transistors MT provided at the memory pillars MP in the memory array area 100, with reference to FIG. 4. FIG. 4 is a sectional view of the memory cell transistors in the memory cell array 11 according to the first embodiment. What is shown in FIG. 4 corresponds to the NAND flash memory 10 of FIG. 3 turned upside down by 180 degrees, and FIG. 4 omits the interlayer insulation films between the conductive layers.

As shown in FIG. 4, the memory cell array 11 includes the conductive layers 41, 43, 44_0 to 44_7, and 45, and the memory pillars MP. The first main surface of the semiconductor substrate 30 is congruent with the X-Y plane. The conductive layer 41 is provided above the semiconductor substrate 30 through the insulation layer. The conductive layer 41 is of a flat plate shape along the X-Y plane, and functions as the source line SL as discussed.

The conductive layers 43, 44_0 to 44_7, and 45 are located above the conductive layer 41, and sequentially provided in this order from below. Among these conductive layers, the conductive layers adjacent in the Z direction are stacked with the interlayer insulation film therebetween. Each of the conductive layers 43, 44_0 to 44_7, and 45 is of a flat plate shape along the X-Y plane. As discussed, the conductive layer 43 functions as the select gate line SGS. The conductive layers 44_0 to 44_7 function as the word lines WL0 to WL7, respectively from below. The conductive layer 45 functions as the select gate line SGD.

The multiple memory pillars MP are arranged in, for example, a staggered pattern in the X and Y directions (not illustrated), and each function as one NAND string NS. Each of the memory pillars MP penetrates through the conductive layers 43, 44_0 to 44_7, and 45, so as to extend from the top face of the conductive layer 45 and reach the top face of the conductive layer 41.

The memory pillars MP each include, for example, a block insulation film 51, a charge storage film (or charge storage layer) 52, a tunnel insulation film 53, and a semiconductor layer 54. More specifically, the block insulation film 51 is disposed on the inner wall of a memory hole for forming each memory pillar MP. The charge storage film 52 is disposed on the inner wall of the block insulation film 51. The tunnel insulation film 53 is disposed on the inner wall of the charge storage film 52. Further, the semiconductor layer 54 is provided more inside than the tunnel insulation film 53. The memory pillars MP may also adopt a structure in which a core insulation layer (e.g., silicon oxide layer) is arranged within the semiconductor layer 54.

With the structure of each memory pillar MP as described, a portion where the memory pillar MP intersects the conductive layer 43 functions as the select gate transistor ST2. Portions where the memory pillar MP intersects the conductive layers 44_0 to 44_7 function as the memory cell transistors MT0 to MT7, respectively. The memory cell transistors MT0 to MT7 each serve as a memory cell intended for or capable of data storage. Further, a portion where the memory pillar MP intersects the conductive layer 45 functions as the select gate transistor ST1.

The semiconductor layer 54 functions as a channel layer for the memory cell transistors MT, and the select gate transistors ST1 and ST2. A current path of the NAND string NS is formed within the semiconductor layer 54.

The charge storage film 52 has a function of accumulating electric charges injected from the semiconductor layer 54 in the memory cell transistor MT. The charge storage film 52 may be, for example, a silicon nitride film.

The tunnel insulation film 53 functions as a potential barrier when electric charges are injected from the semiconductor layer 54 into the charge storage film 52 or when electric charges accumulated in the charge storage film 52 are released to the semiconductor layer 54. The tunnel insulation film 53 may be, for example, a silicon oxide film.

The block insulation film 51 prevents electric charges accumulated in the charge storage film 52 from being released to the conductive layers 44_0 to 44_7 (word lines WL). The block insulation film 51 may be, for example, a combination of a silicon oxide film and a silicon nitride film.

The conductive layer 46A is provided above the top of the memory pillar MP through an insulation film. The conductive layer 46A is formed in a linear shape extending in the Y direction, and functions as the bit line BL (or an interconnect layer). More than one conductive layer 46A is arranged in the X direction (not illustrated), and each is electrically connected to the corresponding single memory pillar MP for one string unit SU. More specifically, for each string unit SU, the contact plug CP1 is provided on the semiconductor layer 54 in one memory pillar MP, and one conductive layer 46A is provided on the contact plug CP1.

The configuration of the memory cell array 11 is, however, not limited to the foregoing description. Also, the numbers of the word lines WL, and the select gate lines SGD and SGS are changed according to the numbers of the memory cell transistors MT, and the select gate transistors ST1 and ST2, respectively. The select gate line SGS may be constituted by multiple conductive layers provided in respective layers. The select gate line SGD may be constituted by multiple conductive layers provided in respective layers.

Moreover, the memory cell array 11 may adopt another structure. For such a structure, for example, reference may be made to the disclosure in U.S. patent application Ser. No. 12/407,403 filed Mar. 19, 2009 and titled "THREE DIMENSIONAL STACKED NONVOLATILE SEMICONDUCTOR MEMORY". Reference may also be made to the disclosure in U.S. patent application Ser. No. 12/406,524 filed Mar. 18, 2009 and titled "THREE DIMENSIONAL STACKED NONVOLATILE SEMICONDUCTOR MEMORY", the disclosure in U.S. patent application Ser. No. 12/679,991 filed Mar. 25, 2010 and titled "NONVOLATILE SEMICONDUCTOR STORAGE DEVICE AND METHOD OF MANUFACTURING THE SAME", and the disclosure in U.S. patent application Ser. No. 12/532,030 filed Mar. 23, 2009 and titled "SEMICONDUCTOR MEMORY AND METHOD FOR MANUFACTURING SAME". The entire contents of these applications are incorporated herein by reference.

2. Method for Manufacturing Semiconductor Memory Device

Now, a method for manufacturing the semiconductor memory device according to the first embodiment will be described. FIGS. 5 to 14 are sectional views for illustrating the method for manufacturing the semiconductor memory device according to the first embodiment.

The formation of the memory array area 100 on the first main surface of the semiconductor substrate 30 (semiconductor wafer), as will be described with reference to FIGS. 5 to 9, may precede others this manufacturing method.

Initially, the insulation layer 40, the conductive pad 47, the conductive layer 41, and the conductive pad 41A are formed on the semiconductor substrate 30. More specifically, the insulation layer 40 is formed on the semiconductor substrate 30 by, for example, the chemical vapor deposition (CVD) method or the atomic layer deposition (ALD) method. Further, the conductive layer 41, the conductive pad 41A, and the conductive pad 47 are formed on the insulation layer 40 or part of the semiconductor substrate 30, by the CVD method (or the ALD method). The conductive layer 41 functions as the source line SL. In the later processing, the conductive pads 41A and 47 will be each connected to the TSV 31.

Figure 5:
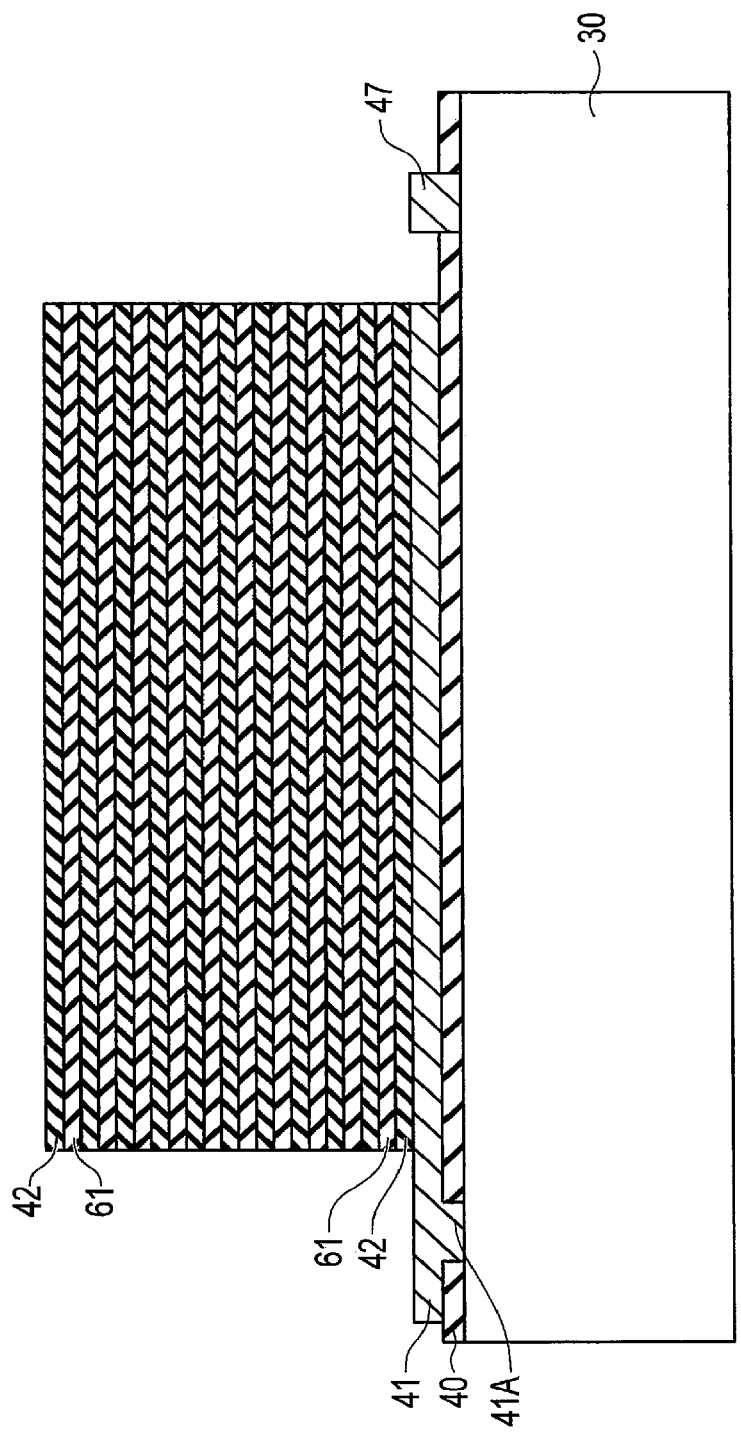
FIGS. 5 to 14 are sectional views pertaining to certain steps in a method for manufacturing the semiconductor memory device according to the first embodiment.

Next, a stack of the multiple insulation layers 42 and the multiple insulation layers 61 is formed on the conductive layer 41, followed by formation of the memory pillars MP in the stack. More specifically, the multiple insulation layers 42 and the multiple insulation layers 61 are alternately stacked on the conductive layer 41 as shown in FIG. 5 by, for example, the CVD method (or the ALD method). The insulation layers 42 may be, for example, silicon oxide layers, and the insulation layers 61 may be, for example, silicon nitride layers.

Figure 6:
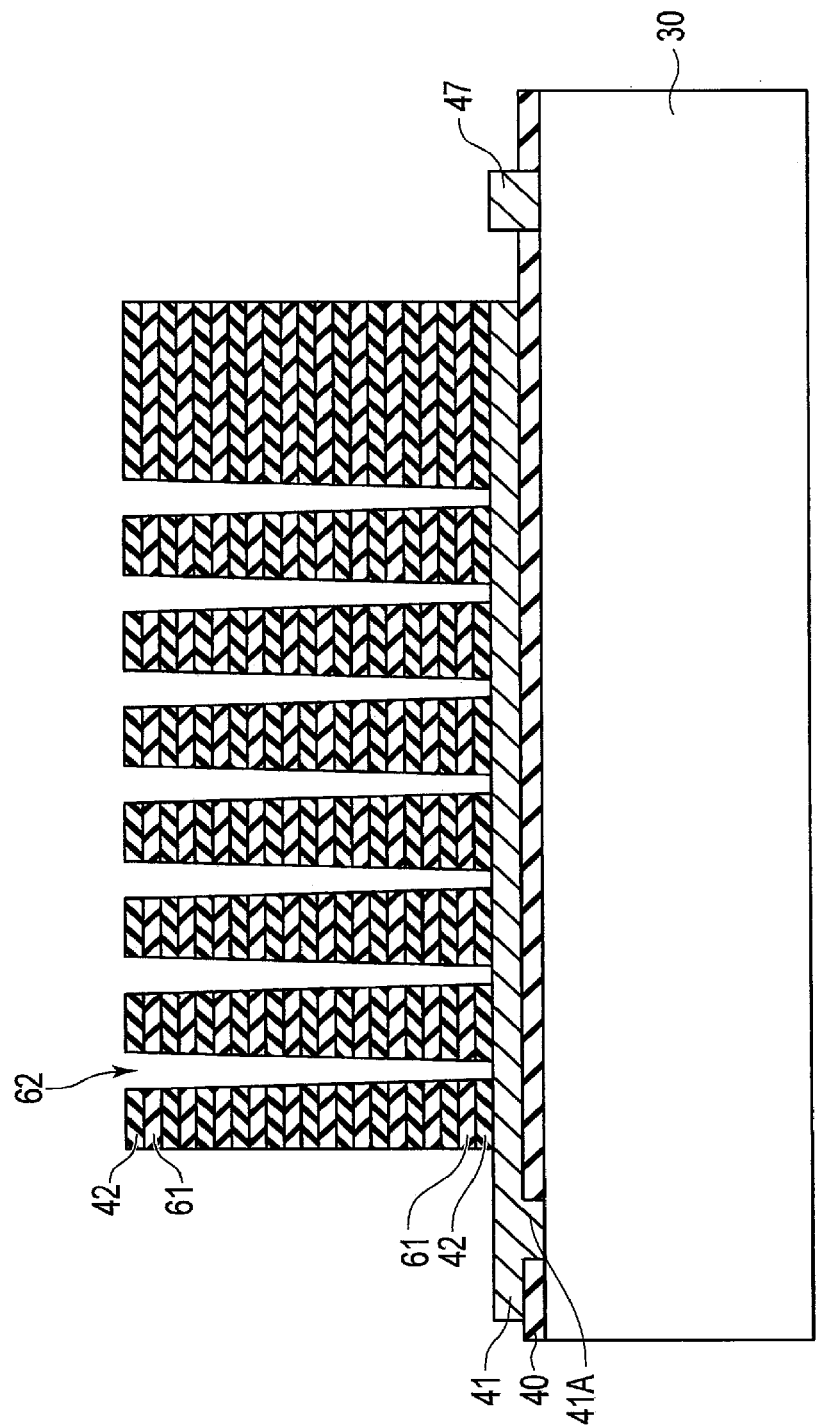

Subsequently, memory holes 62 are formed in the multiple insulation layers 42 and the multiple insulation layers 61 as shown in FIG. 6 by, for example, the reactive ion etching (RIE) method. The memory holes 62 extend from the surface of the uppermost insulation layer 42 to the surface of the conductive layer 41.

Figure 7:
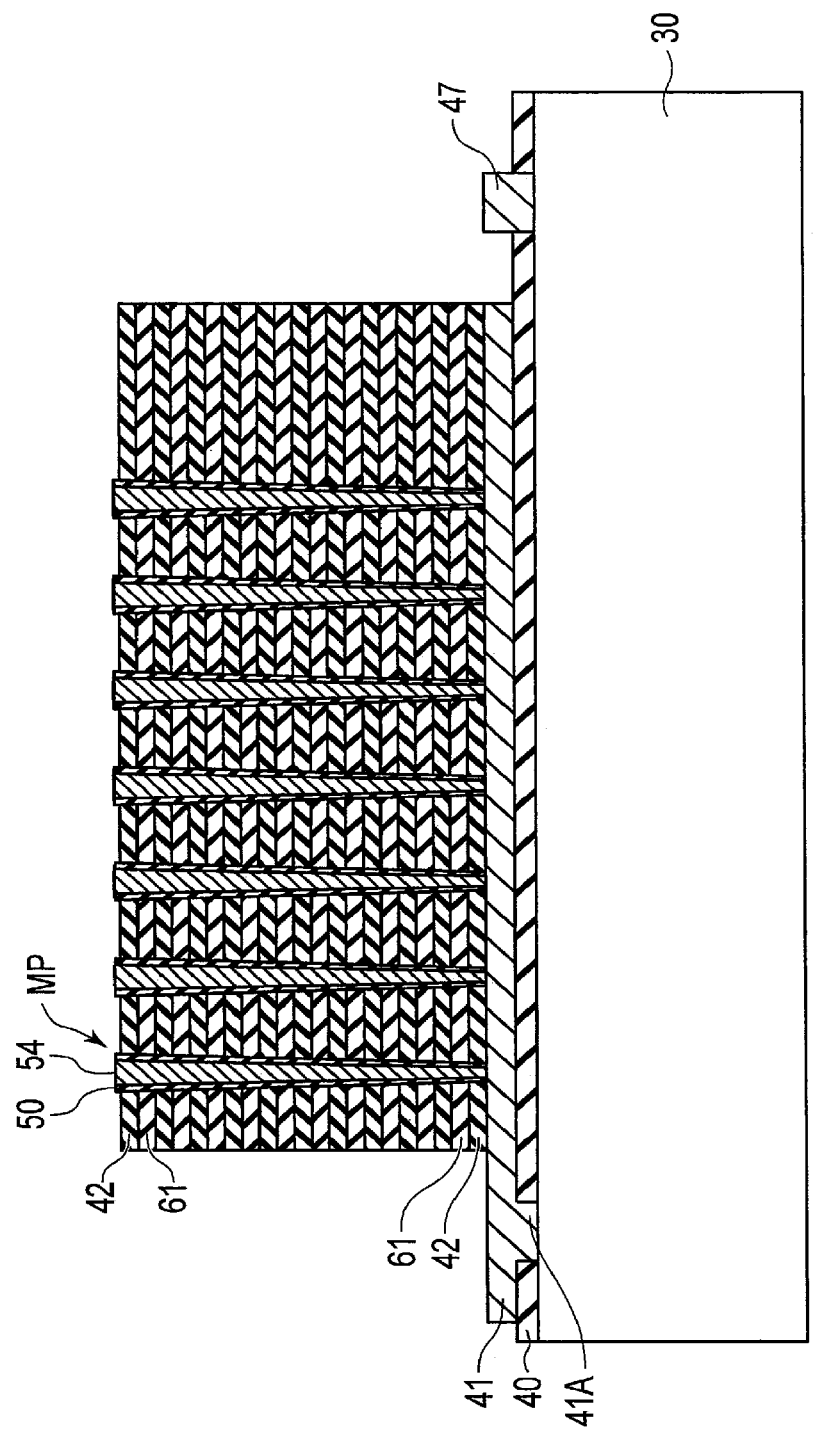

Then, a cell insulation film 50 and the semiconductor layer 54 are formed in each of the memory holes 62. The cell insulation film 50 is constituted by the block insulation film 51, the charge storage film 52, and the tunnel insulation film 53 described above. More specifically, the block insulation film 51 is formed on the inner wall of the memory hole 62 as shown in FIG. 7 by, for example, the CVD method (or the ALD method). The charge storage film 52 is formed on the inner wall of the block insulation film 51. The tunnel insulation film 53 is formed on the inner wall of the charge storage film 52. Subsequently, the cell insulation film 50 at the bottom of the memory hole 62 is removed by the RIE method to expose the surface of the conductive layer 41. Then, the semiconductor layer 54 is formed in the space further inside than the tunnel insulation film 53 and on the bottom of the memory hole 62. The memory pillar MP with the cell insulation film 50 and the semiconductor layer 54 is thus formed in each of the memory holes 62 formed in the stack.

Next, the insulation layers 61 in the stack are removed for replacement with the conductive layers 43, 44_0 to 44_7, and 45, so that the select gate line SGS, the word lines WL0 to WL7, and the select gate line SGD are formed. More specifically, a slit (not illustrated) is formed in the stack of the multiple insulation layers 42 and the multiple insulation layers 61 by, for example, the RIE method. The slit extends from the surface of the uppermost insulation layer 42 to the surface of the conductive layer 41. Subsequently, the insulation layers 61 (silicon nitride layers) are removed through the slit by, for example, wet etching with a phosphoric acid solution. This wet etching, however, does not remove the insulation layers 42 (silicon oxide layers), and therefore, the insulation layers 42 remain. This produces a gap between the neighboring insulation layers 42.

Figure 8:
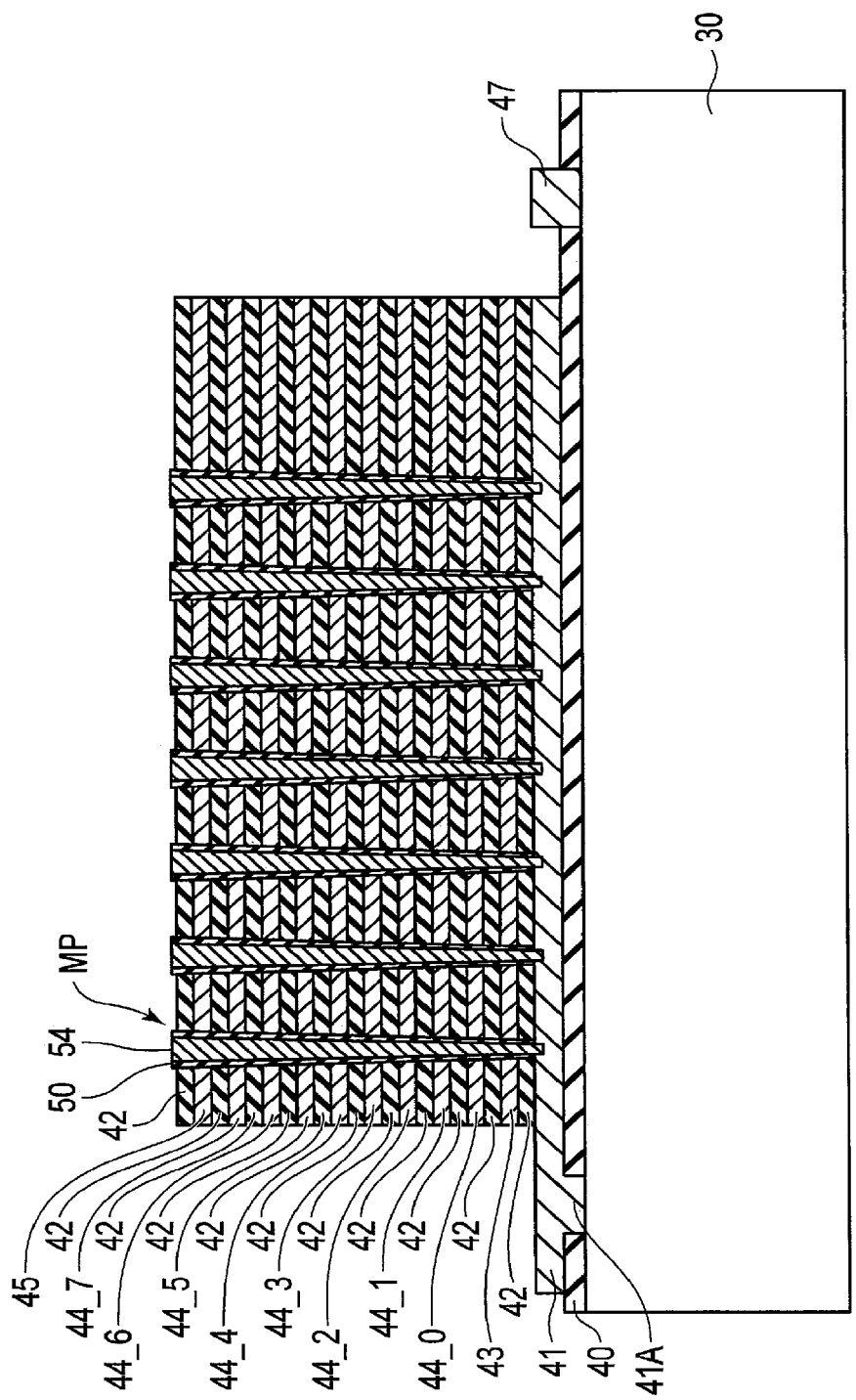

Then, as shown in FIG. 8, the conductive layers 43, 44_0 to 44_7, and 45 are formed in such a manner as to fill the gaps between the insulation layers 42 by the CVD method (or the ALD method). The conductive layers 43, 44_0 to 44_7, and 45 function as the select gate line SGS, the word lines WL0 to WL7, and the select gate line SGD, respectively.

Figure 9:
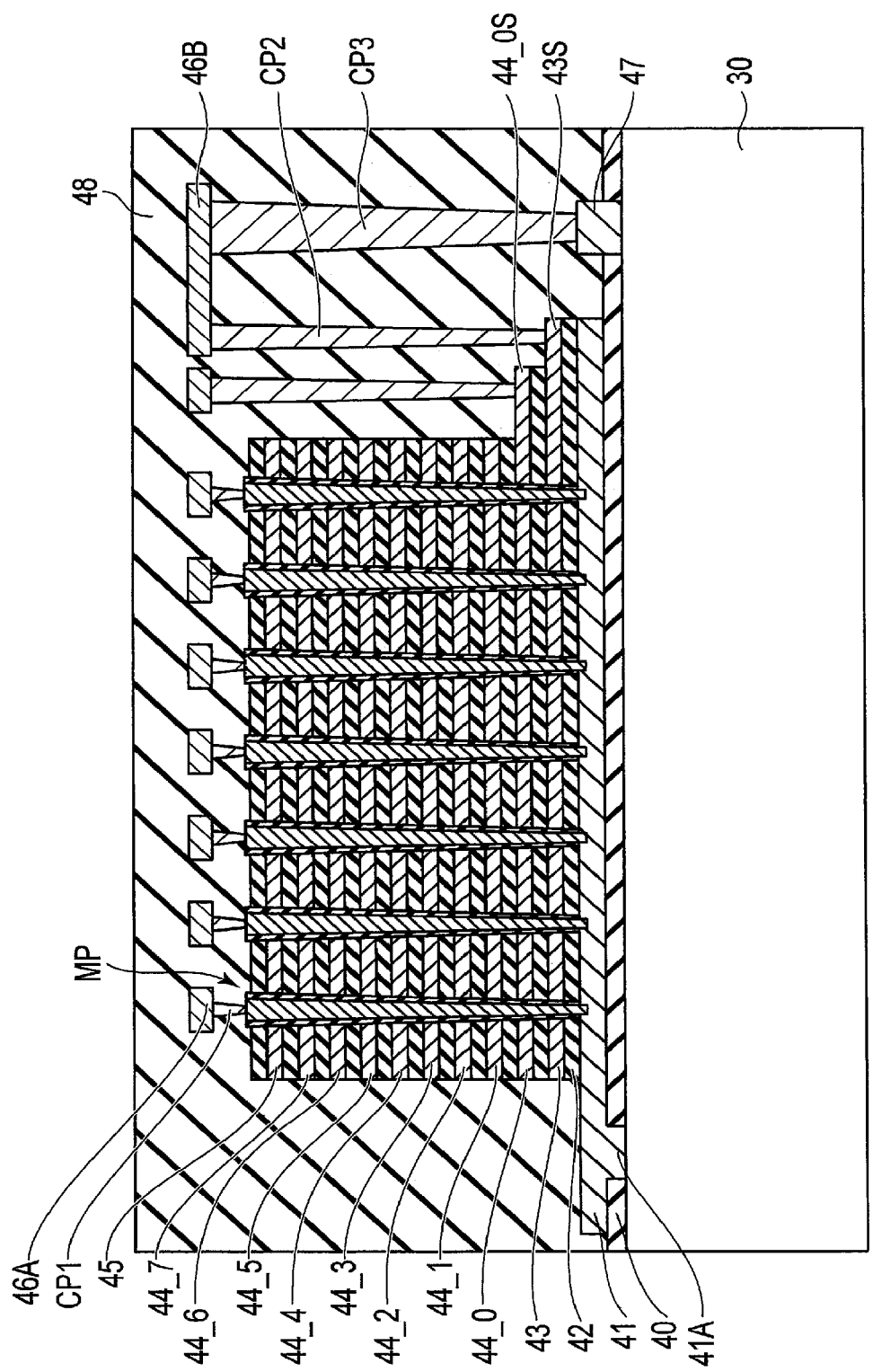

Next, the staircase regions for providing contacts to the conductive layers 43, 44_0 to 44_7, and 45 in the stack are formed. More specifically, the conductive layers 43, 44_0 to 44_7, and 45 are etched in a stepwise manner by the photolithography method to form the staircase regions in the respective conductive layers 43, 44_0 to 44_7, and 45, where these layers are sequentially drawn in the X direction. FIG. 9 shows the staircase regions 43S and 44_0S formed in the conductive layers 43 and 44_0. The other conductive layers 44_1 to 44_7, and 45 are also formed with the staircase regions sequentially drawn in the X direction.

Next, the contact plugs CP1 to CP3, and the conductive layers 46A and 46B (interconnects) are each formed on the corresponding member of the memory pillars MP, the conductive layers 41, 43, 44_0 to 44_7, and 45, and the conductive pad 47. More specifically, the insulation layer 48 is formed on the stack, the memory pillars MP, the conductive pad 47, the conductive layer 41, and the staircase regions by, for example, the CVD method (or the ALD method). Then, holes for contact plugs are formed in the insulation layer 48 on the memory pillars MP, the conductive pad 47, and the staircase regions by, for example, the RIE method. Subsequently, as shown in FIG. 9, the holes for contact plugs are filled with a conductive material to form the contact plugs CP1 to CP3 by, for example, the CVD method (or the ALD method). Furthermore, the conductive layers 46A and 46B are each formed on the corresponding member of the contact plugs CP1 to CP3 by, for example, the CVD method (or the ALD method). The insulation layer 48 is then formed on the conductive layers 46A and 46B. The conductive material of the contact plugs CP1 to CP3 includes, for example, tungsten.

Figure 10:
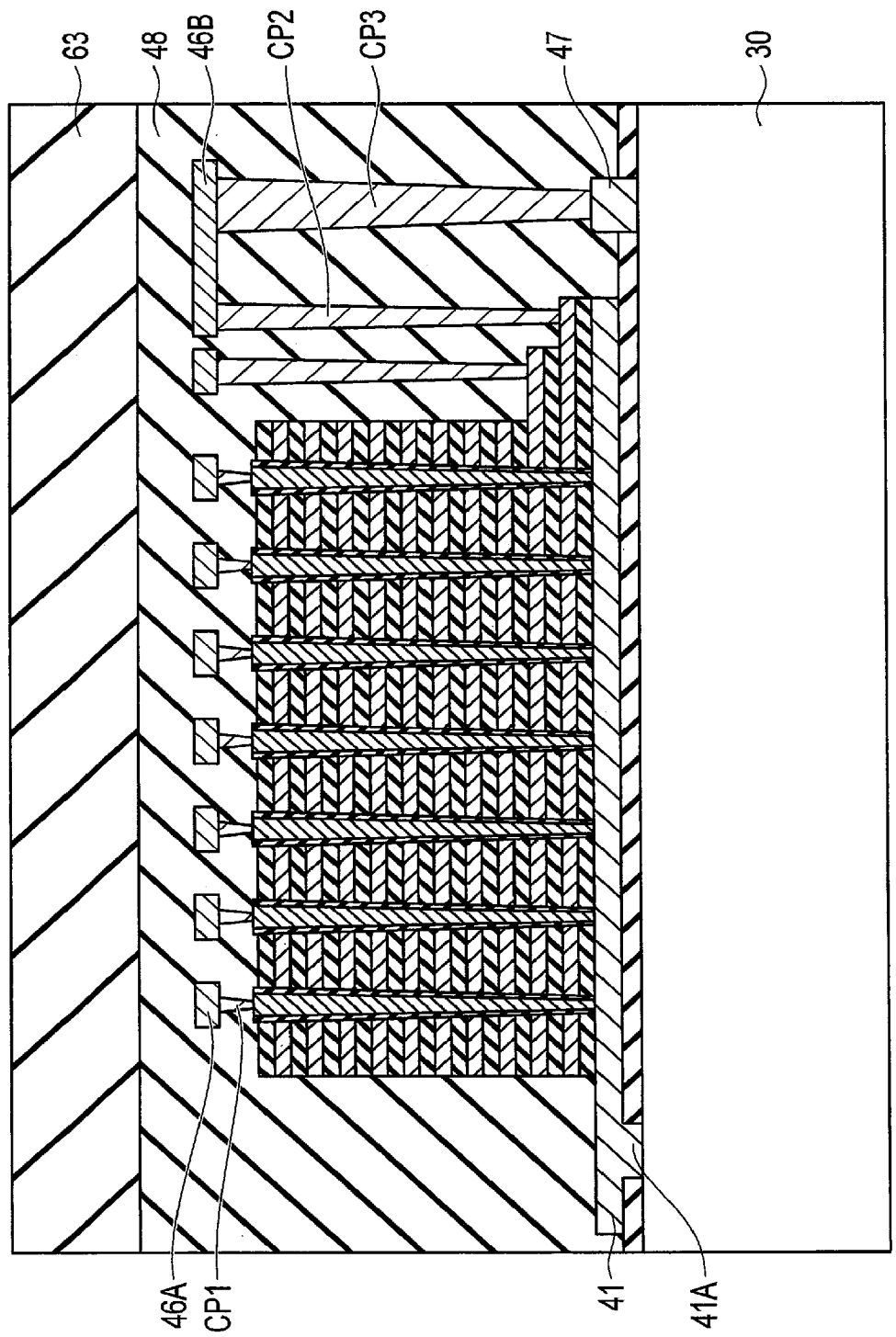

Next, as shown in FIG. 10, a protective layer 63 is formed on the insulation layer 48 by, for example, the CVD method (or the ALD method). The protective layer 63 will serve as a protection for the interconnect layers (conductive layers 46A and 46B) and the memory cell array in the later processing. The protective layer 63 may be, for example, a silicon oxide layer or a polycrystalline silicon layer. Note that the protective layer 63 should preferably be formed of polycrystalline silicon if the protective layer 63 is required to be electrically connected to a semiconductor substrate that is to be bonded onto the protective layer 63 in the succeeding processing.

Figure 11:
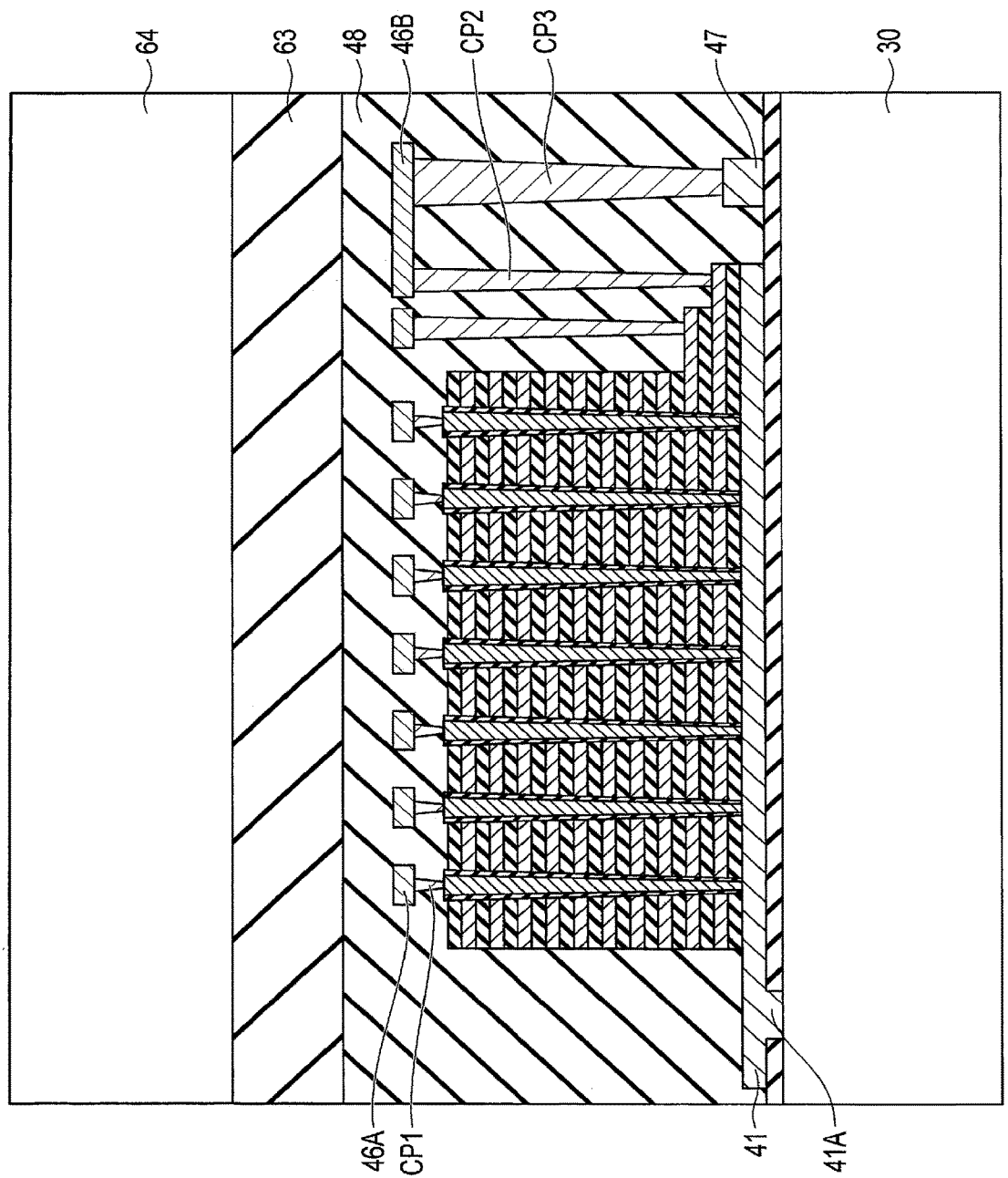

Next, as shown in FIG. 11, a semiconductor substrate (semiconductor wafer) is bonded onto the protective layer 63. More specifically, the semiconductor substrate 64 is bonded on the surface of the protective layer 63. The protective layer 63 and the semiconductor substrate 64 are therefore attached to each other with a certain strength. In the later processing, the semiconductor substrate 64 will support the load during the manufacture. The semiconductor substrate 64 may be, for example, a silicon semiconductor substrate.

Figure 12:
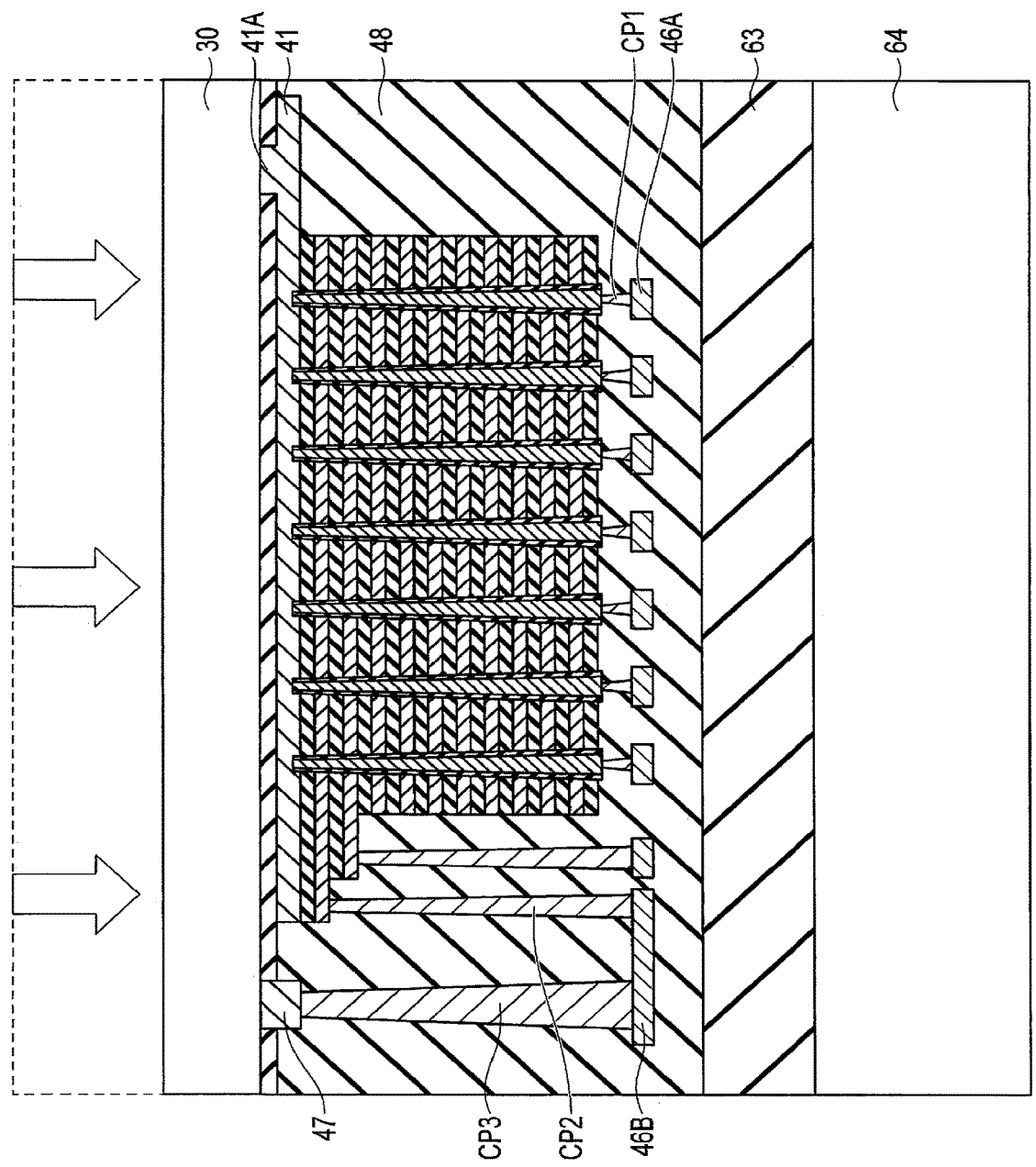
Figure 13:
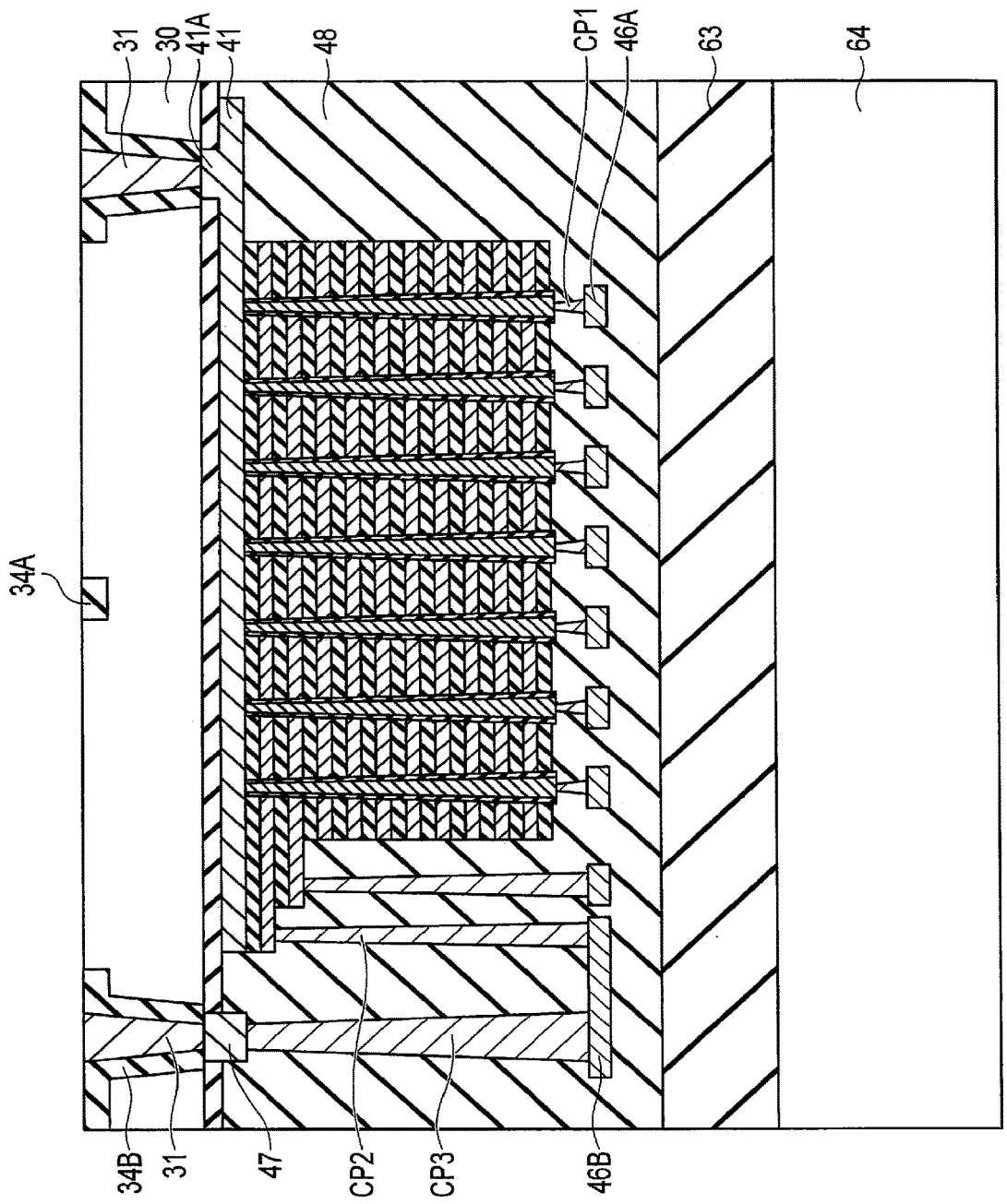
Figure 14:
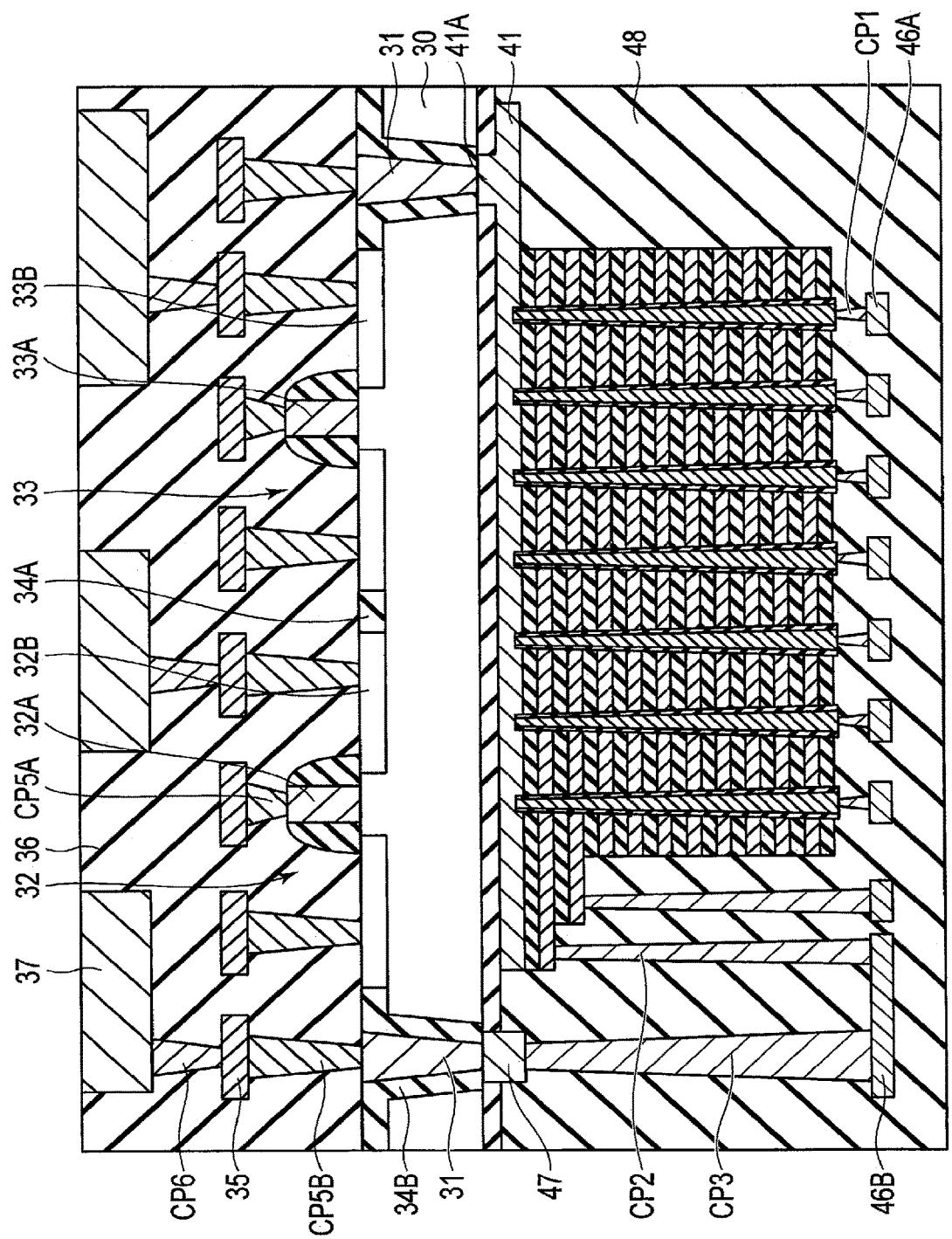

Now, the peripheral circuit area 200 will be formed on the second main surface of the semiconductor substrate 30, as shown in FIGS. 12 to 14.

First, as shown in FIG. 12, the semiconductor substrate 30 is abraded and thinned so that the TSV 31 can be formed in the semiconductor substrate 30. More specifically, the semiconductor substrate 30 of FIG. 11 is turned upside down by 180 degrees, and the second main surface of the semiconductor substrate 30 is subjected to abrading processing or the like, e.g., grinding or chemical mechanical polishing (CMP), as shown in FIG. 12. By this abrading or the like, the semiconductor substrate 30 is processed to have a thickness that allows for the formation of the TSV 31 in the semiconductor substrate 30, e.g., a thickness of about 2 to 10 μm (2 μm or greater and 10 μm or smaller).

Next, as shown in FIG. 13, the TSV 31 and the element isolation region 34A (e.g., STI) are formed in the semiconductor substrate 30. More specifically, holes for TSV are formed in the semiconductor substrate 30 by, for example, the RIE method. Then, the insulation layer 34B is formed in each of the holes for TSV by, for example, the CVD method (or the ALD method). Further, the space further inside than the insulation layer 34B is filled with a conductive material by, for example, the CVD method (or the ALD method), so that the TSV 31 are formed as shown in FIG. 13. Each TSV 31 therefore extends from the second main surface to the first main surface of the semiconductor substrate 30, and is connected to the conductive pad 47 or the conductive pad 41A. The conductive material of the TSV 31 includes, for example, tungsten. Also, the element isolation region 34A (e.g., STI) is formed in the semiconductor substrate 30.

For the formation of the TSV 31, it is desirable that the holes for TSV are formed to have a diameter larger than the outer diameter of the conductive pads 47 and 41A, so that the conductive pads 47 and 41A will not be in contact with the semiconductor substrate 30. Optionally, or alternatively, an insulation layer may be disposed between the semiconductor substrate 30 and the conductive pads 47 and 41A, and the TSV 31 may be formed to reach the conductive pads 47 and 41A through this insulation layer. Note that forming the TSV 31 to reach the conductive pad 41A which contacts the conductive layer 41 (source line SL) can reduce the resistance in the connection between the conductive layer 41 and the TSV 31.

Next, peripheral circuitry, the conductive layers 35 (interconnect), and the electrode pads 37 are formed on the second main surface of the semiconductor substrate 30, as shown in FIG. 14. More specifically, a CMOS circuit including the nMOS transistor 32 and the pMOS transistor 33 is formed on the second main surface of the semiconductor substrate 30. Then, the insulation layer 36 is formed on the nMOS transistor 32 and the pMOS transistor 33, and on the semiconductor substrate 30 by, for example, the CVD method (or the ALD method).

Subsequently, holes for contact plugs are formed in the insulation layer 36 above the gates 32A and 33A of the nMOS transistor 32 and the pMOS transistor 33, and filled with a conductive material to form the respective contact plugs CP5A. Similarly, holes for contact plugs are formed in the insulation layer 36 above the source/drain 32B and 33B of the nMOS transistor 32 and the pMOS transistor 33, and filled with a conductive material to form the respective contact plugs CP5B. Furthermore, the conductive layers 35 are formed on the respective contact plugs CP5A and CP5B by, for example, the CVD method (or the ALD method). The conductive material of the contact plugs CP5A and CP5B includes, for example, tungsten.

The insulation layer 36 is then formed on the conductive layers 35 by, for example, the CVD method (or the ALD method). Furthermore, holes for contact plugs are formed in the insulation layer 36 on the respective corresponding conductive layers 35, and filled with a conductive material to form the contact plugs CP6. The electrode pads 37 are then formed in the insulation layer 36 on the contact plugs CP6 by, for example, the CVD method (or the ALD method). The electrode pads 37 are each formed at the top face of the insulation layer 36, and each have an exposed surface.

Thereafter, the protective layer 63 and the semiconductor substrate 64 formed over the insulation layer 48 are removed. In this manner, the semiconductor memory device shown in FIG. 14 is manufactured.

Additionally, in the instance of the three-dimensional stacking arrangement of multiple memory chips as will be discussed for the second embodiment, the electrode pads 49 are formed at the top face of the memory array area 100 as shown in FIG. 3.

In the manner as has been described, the semiconductor memory device according to the first embodiment is manufactured.

3. Modification of First Embodiment

A semiconductor memory device according to a modification of the first embodiment will be described. A semiconductor memory device 10*m* according to the modification is an example corresponding to the sectional structure shown in FIG. 3 and providing contact plugs that penetrate through the stack of the insulation layers 42 and the conductive layers 43, 44_0 to 44_7, and 45. The rest of the configuration adopted in this modification is the same as the structure shown in FIG. 3. For the modification, the differences from the first embodiment will be described mainly.

Figure 15:
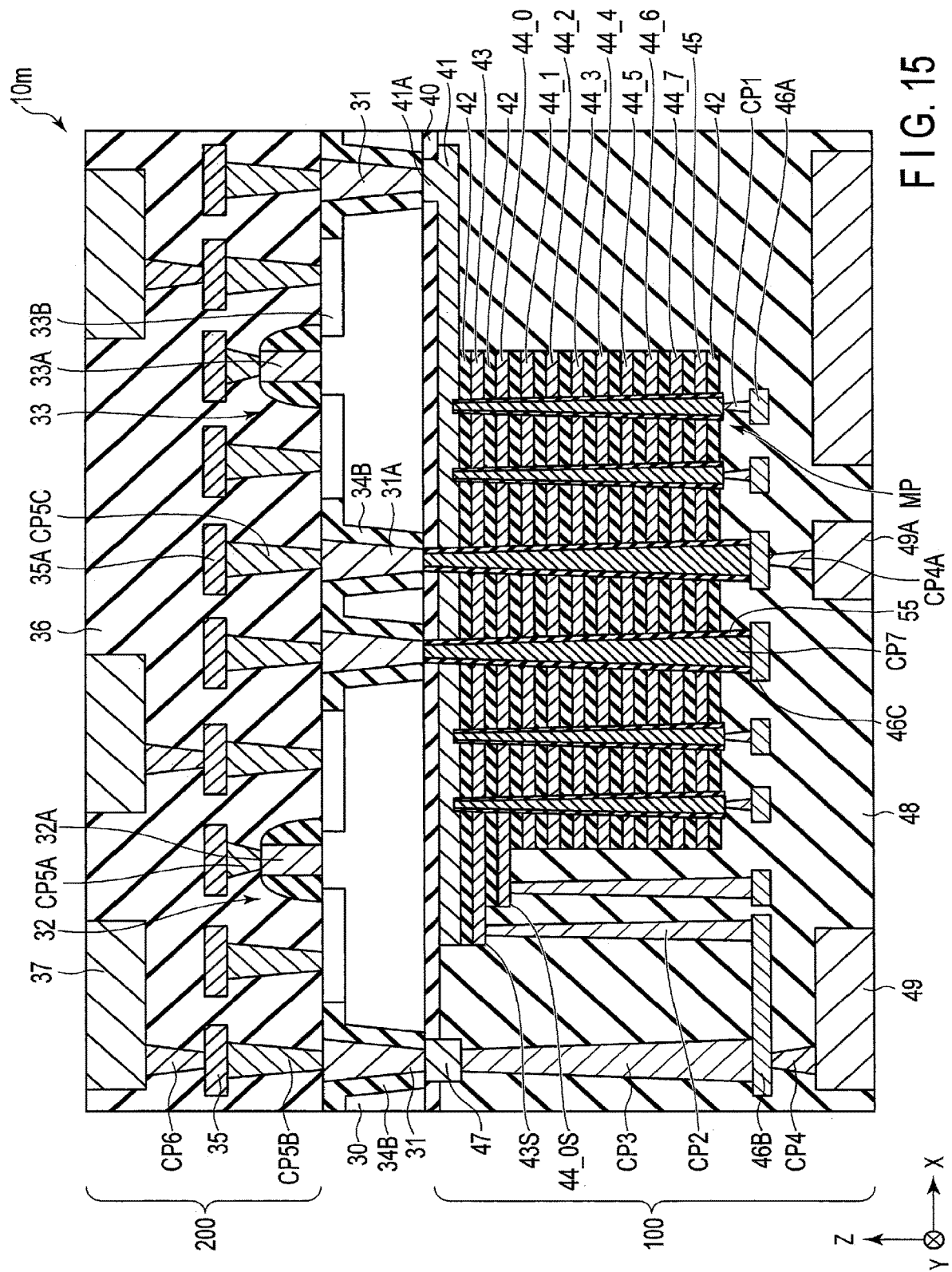
FIG. 15 is a sectional view of a semiconductor memory device according to a modification of the first embodiment.

3.1 Sectional Structure of Semiconductor Memory Device According to Modification FIG. 15 is a sectional view of the semiconductor memory device 10*m* according to the modification of the first embodiment. In the multiple insulation layers 42 and the multiple conductive layers 43, 44_0 to 44_7, and 45, one or more contact plugs CP7 penetrating (or extending) in the Z direction are provided. The contact plug CP7 has one end connected to a TSV 31A. The other end of the contact plug CP7 is connected to a conductive layer 46C. The contact plug CP7 is surrounded by an insulation layer 55. The insulation layer 55 insulates the contact plug CP7 from the conductive layers 41, 43, 44_0 to 44_7, and 45. The contact plug CP7, the TSV 31A, and the conductive layer 46C include, for example, tungsten (W). The insulation layer 55 may be, for example, a silicon oxide layer.

The TSV 31A connected at one end of the contact plug CP7 is connected to a conductive layer 35A through a contact plug CP5C. The conductive layer 35A is electrically connected to, for example, a circuit wiring of the sense amplifier 14. The contact plug TSV 31A is surrounded by the insulation layer 34B. The conductive layer 46C connected at the other end of the contact plug CP7 is connected to an electrode pad 49A through a contact plug CP4A. The electrode pad 49A serves as, for example, a terminal to receive external input of a source voltage, etc., to be applied to the peripheral circuitry. Note that the conductive layer 46C connected at the other end of the contact plug CP7 may be electrically connected to the conductive layer 46A, i.e., the bit line, through a wiring disposed in the insulation layer 48, instead of being connected to the electrode pad 49A. In this case, the bit line is electrically connected to the sense amplifier 14 in the peripheral circuit area 200, through the contact plug CP7 and the TSV 31A. The contact plugs CP4A and CP5C, the conductive layer 35A, and the electrode pad 49A include, for example, tungsten (W).

Figure 16:
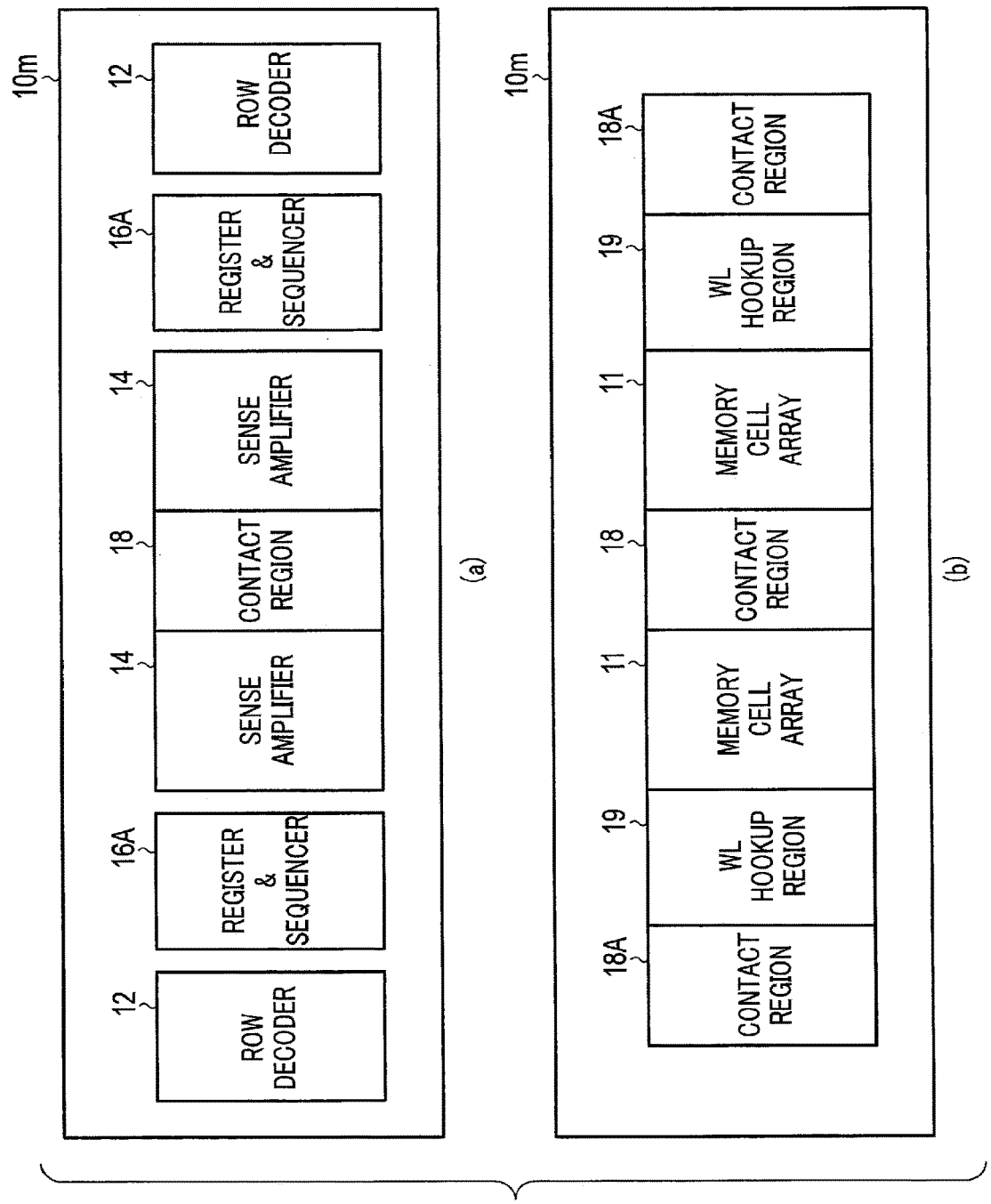
FIG. 16 is a layout of a circuit block in the semiconductor memory device according to the modification.

FIG. 16 shows a layout of the circuit block in the semiconductor memory device 10m according to the modification. In FIG. 16, (a) is the semiconductor memory device 10m viewed from above in the Z direction, and (b) is the semiconductor memory device 10m viewed from below in the Z direction.

Referring to FIG. 16, (a) and (b), WL hookup regions 19 are arranged at the respective ends of the memory cell array 11. Each WL hookup region 19 is where the word lines WL form stair terraces and these terrace portions are connected to the contacts, and as such, the WL hookup region 19 corresponds to the staircase regions discussed above. A contact region 18A is arranged on an outer side of each WL hookup region 19. The contact region 18A is where the contact plug CP3 and the TSV 31 are arranged. The row decoder 12 is located at a position opposite the contact region 18A, and electrically connected to each word line WL there.

One or more contact regions 18 are arranged in the memory cell array 11. The contact region 18 is where the contact plug CP7 and the TSV 31A are arranged. The sense amplifier 14 is located at a position opposite and around the contact region 18, and electrically connected to each bit line BL.

A set of a register and a sequencer 16A is arranged between the row decoder 12 and the sense amplifier 14. Where to arrange the register and the sequencer 16A is not limited to this. For example, the location of the register and the sequencer 16A and the location of the row decoder 12 may be switched with each other.

4. Effects of First Embodiment

With the semiconductor memory device according to the first embodiment, it is possible to reduce the substrate area while enhancing the reliability of peripheral circuitry provided for operating memory cells.

The art pertinent to the embodiments, as well as the effects of the first embodiment will be described in detail. A semiconductor memory device includes a memory cell array in which multiple memory cells are arranged, and peripheral circuitry which is for performing memory cell operations such as write, read, and erase. The peripheral circuitry includes a cMOS circuit with pMOS and nMOS transistors, and also includes lower interconnects, etc. Such a memory cell array and peripheral circuitry are formed on the same, single semiconductor substrate (or chip). Thus, to cope with a demand for a reduced substrate area (or a reduced chip area), a structure having the peripheral circuitry below the memory cell array is often adopted. Namely, a structure in which the peripheral circuitry is disposed on the semiconductor substrate, and then the memory cell array is disposed on the peripheral circuitry, is often adopted.

With such a structure, the memory cell array must be formed after the formation of the peripheral circuitry. As such, the pMOS and nMOS transistors and the lower interconnects are placed under the influence of thermal processes during the formation of the memory cell array. This would result in the deterioration of the properties of the pMOS and nMOS transistors, resistance or other properties of the lower interconnects, and so on.

According to the first embodiment, a memory cell array is provided on the first main surface of a semiconductor substrate, and peripheral circuitry is provided on the second main surface opposite the first main surface. Further, vias for electrical connection between the memory cell array and the peripheral circuitry are provided in the semiconductor substrate. This allows for the formation of the memory cell array on the first main surface of the semiconductor substrate, followed by the formation of the peripheral circuitry on the second main surface. Accordingly, the peripheral circuitry can be made free from the influence of the thermal processes performed during the formation of the memory cell array. In other words, it is possible to prevent the deterioration of the properties of the pMOS and nMOS transistors, resistance or other properties of the lower interconnects, etc., that would otherwise occur due to the influence of the thermal processes during the formation of the memory cell array.

Moreover, since the memory cell array and the peripheral circuitry are not arranged side by side on one main surface of the semiconductor substrate, but arranged on the respective two opposite main surfaces (i.e., both surfaces) of the semiconductor substrate, the first embodiment can reduce the substrate area required for the formation of the memory cell array and the peripheral circuitry. As the substrate area for forming the semiconductor memory device can be reduced, the first embodiment can provide further advantages of reducing power consumption during operations, and accelerating the operations.

Still more, since the influence of the thermal processes during the formation of the memory cell array can be eliminated, the first embodiment tolerates the use of aluminum (Al) or copper (Cu) for the electrode pads 37 and 49, and copper (Cu) for the conductive layers 35. Therefore, connection resistance at the electrodes, and resistance in the interconnects can be reduced.

Second Embodiment

Next, a semiconductor memory device according to the second embodiment will be described. For the second embodiment, the description will use an example where multiple NAND flash memories, each corresponding to the NAND flash memory 10 discussed for the first embodiment (hereinafter, "memory chip"), are three-dimensionally stacked. The multiple memory chips 10 according to the first embodiment can be stacked together while making electrical connection therebetween, by jointing the electrode pads provided at the top faces of the respective memory chips. Note that the semiconductor memory device 10m according to the modification of the first embodiment can likewise be stacked three-dimensionally.

1. Configuration of Semiconductor Memory Device

It will be assumed that the semiconductor memory device according to the second embodiment includes three memory chips of the first embodiment, denoted as 10A, 10B, and 10C. The memory chips 10A, 10B, and 10C may be of the same configuration, or of different configurations. Also, while the description will assume three memory chips, the number of the memory chips is not limited to three, but may be two or any number equal to or greater than four.

Figure 17:
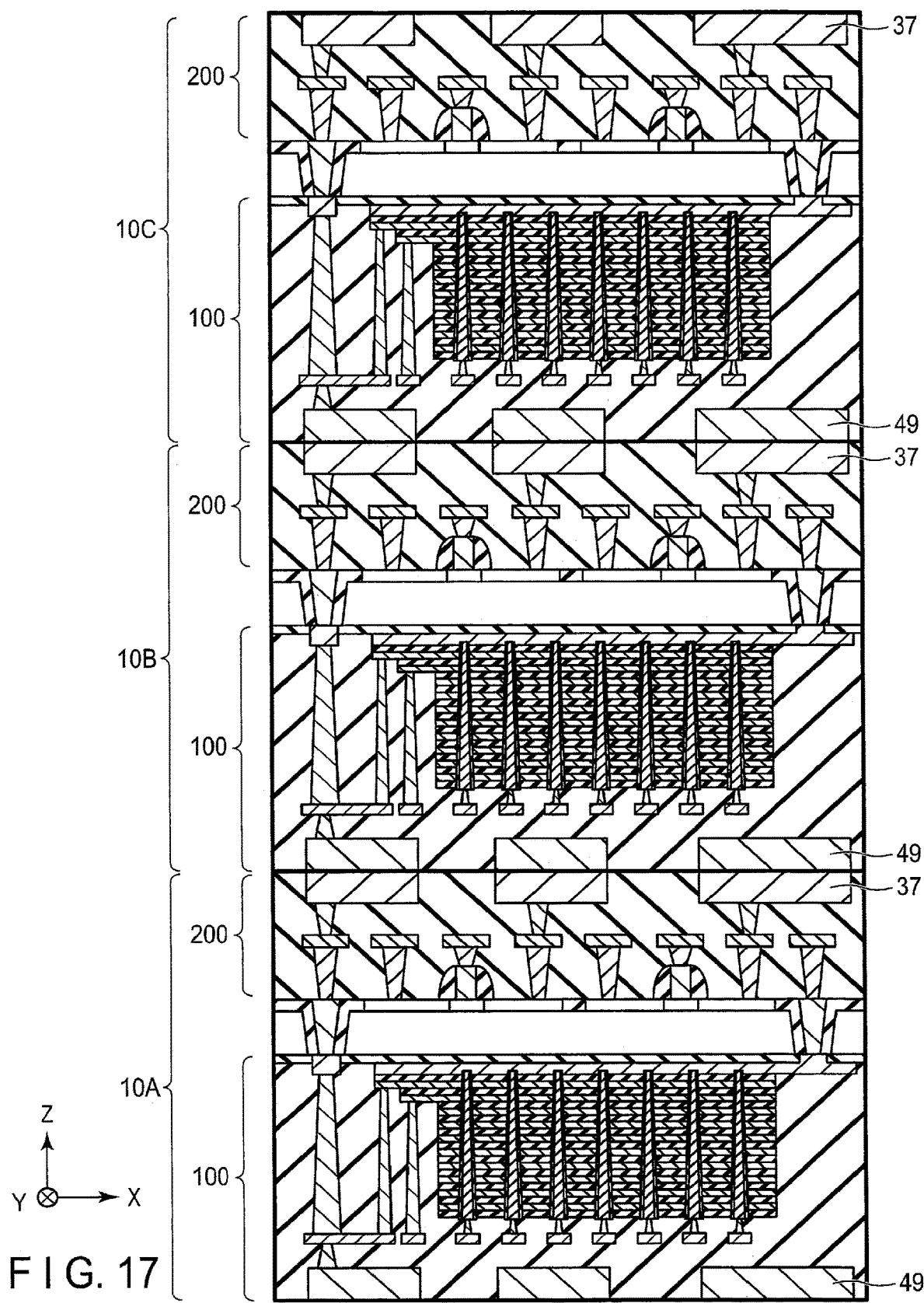
FIG. 17 is a sectional view of a first exemplary configuration of a semiconductor memory device according to a second embodiment.

FIG. 17 is a sectional view of a first exemplary configuration of the semiconductor memory device according to the second embodiment. The memory chip 10B is stacked on the memory chip 10A in the Z direction, and the memory chip 10C is stacked on the memory chip 10B in the Z direction. Each of the memory chips 10A, 10B, and 10C includes the memory array area 100 embracing the memory cell array 11, and the peripheral circuit area 200 embracing the peripheral circuitry. The memory chips 10A, 10B, and 10C each have the electrode pad 49 at the top face of the memory array area 100. Also, the memory chips 10A, 10B, and 10C each have the electrode pad 37 at the top face of the peripheral circuit area 200.

The memory cell array 11 and the peripheral circuitry of the memory chip 10A are electrically connected to the memory cell array 11 and the peripheral circuitry of the memory chip 10B through the electrode pads 37 and 49. The memory cell array 11 and the peripheral circuitry of the memory chip 10B are electrically connected to the memory cell array 11 and the peripheral circuitry of the memory chip 10C through their electrode pads 37 and 49.

More specifically, the electrode pad 37 in the peripheral circuit area 200 of the memory chip 10A and the electrode pad 49 in the memory array area 100 of the memory chip 10B are positioned so that they face each other. The electrode pad 37 of the memory chip 10A and the electrode pad 49 of the memory chip 10B are thereby bonded and electrically connected to each other. Furthermore, the electrode pad 37 in the peripheral circuit area 200 of the memory chip 10B and the electrode pad 49 in the memory array area 100 of the memory chip 10C are positioned so that they face each other. The electrode pad 37 of the memory chip 10B and the electrode pad 49 of the memory chip 10C are thereby bonded and electrically connected to each other. Accordingly, the memory cell arrays 11 and the peripheral circuitry members in the memory chips 10A, 10B, and 10C are electrically connected to one another.

Figure 18:
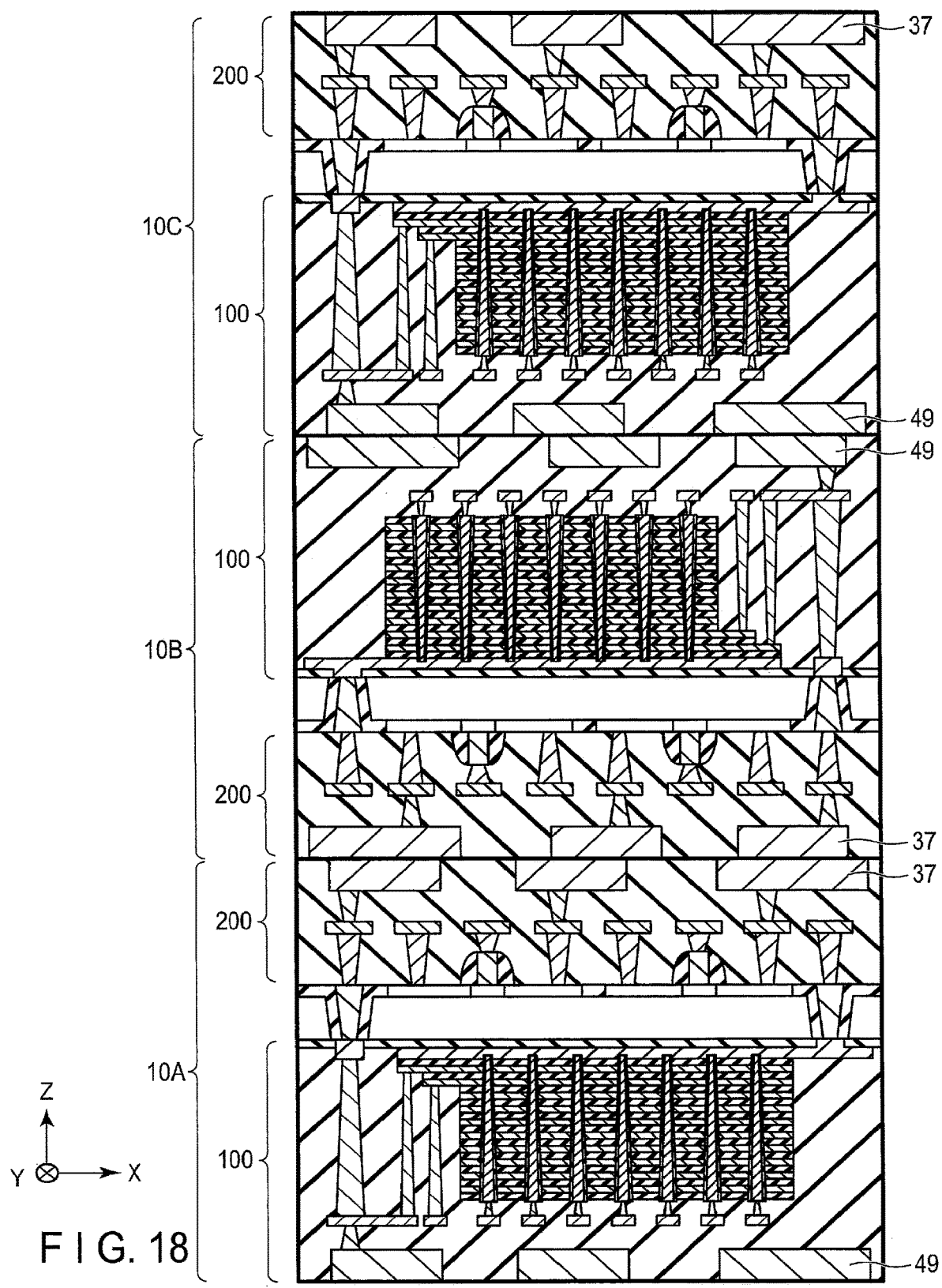
FIG. 18 is a sectional view of a second exemplary configuration of the semiconductor memory device according to the second embodiment.

Next, a second exemplary configuration of the semiconductor memory device according to the second embodiment will be described with reference to FIG. 18. FIG. 18 is a sectional view of the second exemplary configuration of the semiconductor memory device according to the second embodiment. As in the first exemplary configuration, the memory chip 10B is stacked on the memory chip 10A in the Z direction, and the memory chip 10C is stacked on the memory chip 10B in the Z direction. The memory chips 10A, 10B, and 10C each have the electrode pad 49 at the top face of the memory array area 100, and the memory chips 10A, 10B, and 10C each have the electrode pad 37 at the top face of the peripheral circuit area 200.

As shown in FIG. 18, the electrode pad 37 in the peripheral circuit area 200 of the memory chip 10A and the electrode pad 37 in the peripheral circuit area 200 of the memory chip 10B are positioned so that they face each other. The electrode pad 37 of the memory chip 10A and the electrode pad 37 of the memory chip 10B are thereby bonded and electrically connected to each other. Furthermore, the electrode pad 49 in the memory array area 100 of the memory chip 10B and the electrode pad 49 in the memory array area 100 of the memory chip 10C are positioned so that they face each other. The electrode pad 49 of the memory chip 10B and the electrode pad 49 of the memory chip 10C are thereby bonded and electrically connected to each other. Therefore, the memory cell arrays 11 and the peripheral circuitry members in the memory chips 10A, 10B, and 10C are electrically connected to one another.

As shown by the first and second exemplary configurations, the three-dimensional stack of the multiple memory chips may be formed by involving any one or combination of the connection between the electrode pad 37 at the top face of the peripheral circuit area 200 and the electrode pad 49 at the top face of the memory array area 100, the connection between the electrode pads 37 at the top faces of the respective peripheral circuit areas 200, or the connection between the electrode pads 49 at the top faces of the respective memory array areas 100.

The rest of the configurations and the structures are the same as those described in relation to the first embodiment.

2. Effects of Second Embodiment

According to the second embodiment, multiple memory chips can be easily stacked in a three-dimensional arrangement (or in the Z direction) by aligning any electrode pad provided on the memory array area 100 and the peripheral circuit area 200, located on the respective sides of a memory chip, with an electrode pad provided on another memory chip in such a manner as to face each other. Accordingly, it is possible to increase the storage capacity of the semiconductor memory device. Besides, the second embodiment provides the same effects as the first embodiment discussed above.

[Others Modifications, etc.]

The foregoing embodiments have assumed examples where the semiconductor memory device is a NAND flash memory. The embodiments are not limited to NAND flash memories, but may be applicable to any types of semiconductor memories as well as various storage devices other than semiconductor memories.

While certain embodiments have been described, they have been presented by way of example only, and they are not intended to limit the scope of the disclosure. These embodiments may be implemented in a variety of other forms with various omissions, substitutions, and changes without departing from their spirit. The embodiments and their modifications are covered by the accompanying claims and their equivalents, as would fall within the scope and the gist of the disclosure.

What is claimed is:

1. A semiconductor memory device, comprising:
   a semiconductor substrate including a first main surface and a second main surface opposite the first main surface;
   a stack provided below the first main surface and including a plurality of conductive layers and a plurality of insulation layers alternately stacked in a first direction crossing the first main surface;
   a pillar extending through the stack in the first direction and including a semiconductor layer;
   a charge storage film provided between the semiconductor layer and one of the plurality of conductive layers;
   a contact plug extending through the plurality of conductive layers in the first direction, the contact plug made of a conductive material and not made of a semiconductive material;
   an insulation layer provided between the contact plug and the plurality of conductive layers;
   a MOS transistor on the second main surface;
   an interconnection layer provided above the MOS transistor; and
   a via through the semiconductor substrate, the via providing electrical connection between an upper end of the contact plug and the interconnection layer, wherein a lower end of the contact plug is electrically connected to a lower end of the semiconductor layer.

2. The semiconductor memory device according to claim 1, further comprising:
a bit line provided below the stack and electrically connected to the lower end of the semiconductor layer, wherein
the bit line is electrically connected to the contact plug.

3. The semiconductor memory device according to claim 1, further comprising:
an electrode pad serving as an I/O terminal, wherein
the electrode pad is electrically connected to the contact plug.

4. The semiconductor memory device according to claim 1, wherein the via comprises a conductor extending through the semiconductor substrate from the second main surface to the first main surface.

5. The semiconductor memory device according to claim 1,
wherein the MOS transistor comprises at least one of an n-channel MOS transistor and a p-channel MOS transistor on the second main surface.

6. The semiconductor memory device according to claim 1, wherein the MOS transistor comprises a portion of a sense amplifier being provided at a position facing toward a memory cell array in the first direction.

7. The semiconductor memory device according to claim 1, further comprising:
a memory cell array including the stack and the pillar, wherein
the memory cell array includes a first region, a second region, and a contact region, the contact region being between the first region and the second region in a second direction crossing the first direction.

8. The semiconductor memory device according to claim 1, wherein the contact plug is made of metal.

9. A semiconductor memory device comprising a first memory chip and a second memory chip, the first memory chip and the second memory chip each comprising:
a semiconductor substrate including a first main surface and a second main surface opposite the first main surface;
a stack provided below the first main surface and including a plurality of conductive layers and a plurality of insulation layers alternately stacked in a first direction crossing the first main surface;
a pillar extending through the stack in the first direction and including a semiconductor layer;
a charge storage film provided between the semiconductor layer and one of the plurality of conductive layers;
a contact plug extending through the plurality of conductive layers in the first direction, the contact plug made of a conductive material and not made of a semiconductive material;
an insulation layer provided between the contact plug and the plurality of conductive layers;
a MOS transistor on the second main surface;
an interconnection layer provided above the MOS transistor; and
a via through the semiconductor substrate, the via providing electrical connection between an upper end of the contact plug and the interconnection layer,
wherein the first memory chip comprises a first pad, and the second memory chip comprises a second pad,
the first memory chip and the second memory chip are positioned so that the first pad and the second pad face each other, and
the second pad is electrically connected to a lower end of the contact plug.

10. The semiconductor memory device according to claim 9, wherein the first pad is at a top portion of the MOS transistor of the first memory chip, and the second pad is at a top portion of the pillar of the second memory chip.

11. The semiconductor memory device according to claim 9, wherein the first pad is at a top portion of the MOS transistor of the first memory chip, and the second pad is at a top portion of the MOS transistor of the second memory chip.

12. The semiconductor memory device according to claim 9, wherein the first pad is at a top portion of the pillar of the first memory chip, and the second pad is at a top portion of the pillar of the second memory chip.

13. The semiconductor memory device according to claim 9, wherein, in at least one of the first memory chip and the second memory chip,
the pillar comprises an insulation film, the charge storage film, a tunnel insulation film, and the semiconductor layer, disposed in this order from a side of the conductive layers.

14. The semiconductor memory device according to claim 9, wherein, in at least one of the first memory chip and the second memory chip, the via comprises a conductor extending through the semiconductor substrate from the second main surface to the first main surface.

15. The semiconductor memory device according to claim 9, wherein, in at least one of the first memory chip and the second memory chip, the MOS transistor comprises at least one of an n-channel MOS transistor and a p-channel MOS transistor on the second main surface.

16. The semiconductor memory device according to claim 9, wherein the contact plug is made of metal.

* * * * *